(12) United States Patent
Yamazaki

(10) Patent No.: US 9,287,294 B2
(45) Date of Patent: Mar. 15, 2016

(54) CAPACITOR AND SEMICONDUCTOR DEVICE HAVING OXIDE SEMICONDUCTOR

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 258 days.

(21) Appl. No.: 13/336,387

(22) Filed: Dec. 23, 2011

(65) Prior Publication Data

US 2012/0161132 A1    Jun. 28, 2012

(30) Foreign Application Priority Data

Dec. 28, 2010    (JP) ................................ 2010-293055

(51) Int. Cl.
*H01L 27/12*    (2006.01)
*C04B 35/58*    (2006.01)
*H01L 29/786*    (2006.01)

(52) U.S. Cl.
CPC ............ *H01L 27/1225* (2013.01); *C04B 35/58* (2013.01); *H01L 27/1255* (2013.01); *C04B 2235/3284* (2013.01); *C04B 2235/3286* (2013.01); *H01L 29/78648* (2013.01)

(58) Field of Classification Search
None
See application file for complete search history.

(56) References Cited

U.S. PATENT DOCUMENTS

| | | | |
|---|---|---|---|
| 3,365,631 A | 1/1968 | Delaney et al. |
| 4,466,081 A | 8/1984 | Masuoka |
| 5,349,366 A | 9/1994 | Yamazaki et al. |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,690,598 B2 | 2/2004 | Oguchi et al. |
| 6,727,522 B1 | 4/2004 | Kawasaki et al. |
| 6,791,863 B2 | 9/2004 | Oguchi et al. |

(Continued)

FOREIGN PATENT DOCUMENTS

| | | |
|---|---|---|
| EP | 1 603 163 A2 | 12/2005 |
| EP | 1 737 044 A1 | 12/2006 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Michael Jung
(74) *Attorney, Agent, or Firm* — Fish & Richardson P.C.

(57) ABSTRACT

An object is to provide a novel semiconductor device which can store data even when power is not supplied in a data storing time and which does not have a limitation on the number of writing operations. The semiconductor device includes a transistor and a capacitor. The transistor includes a first oxide semiconductor layer, a source electrode and a drain electrode which are in contact with the first oxide semiconductor layer, a gate electrode overlapping with the first oxide semiconductor layer, and a gate insulating layer between the first oxide semiconductor layer and the gate electrode. The capacitor includes the source electrode or the drain electrode, a second oxide semiconductor layer in contact with the source electrode or the drain electrode, and a capacitor electrode in contact with the second oxide semiconductor layer.

29 Claims, 20 Drawing Sheets

(56) References Cited

U.S. PATENT DOCUMENTS

| | | |
|---|---|---|
| 6,846,703 B2 | 1/2005 | Shimoda et al. |
| 6,881,975 B2 | 4/2005 | Anzai et al. |
| 6,972,985 B2 | 12/2005 | Rinerson et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,554,169 B2 | 6/2009 | Anzai et al. |
| 7,575,966 B2 * | 8/2009 | Lai et al. ............... 438/153 |
| 7,674,650 B2 | 3/2010 | Akimoto et al. |
| 7,732,819 B2 | 6/2010 | Akimoto et al. |
| 7,772,021 B2 * | 8/2010 | Lee et al. ............... 438/30 |
| 7,791,074 B2 | 9/2010 | Iwasaki |
| 7,939,831 B2 | 5/2011 | Anzai et al. |
| 8,036,010 B2 | 10/2011 | Maejima |
| 8,202,365 B2 | 6/2012 | Umeda et al. |
| 8,461,582 B2 | 6/2013 | Kimura |
| 8,759,206 B2 | 6/2014 | Kimura |
| 2001/0046027 A1 | 11/2001 | Tai et al. |
| 2002/0018357 A1 | 2/2002 | Oguchi et al. |
| 2002/0056838 A1 | 5/2002 | Ogawa |
| 2002/0132454 A1 | 9/2002 | Ohtsu et al. |
| 2003/0057423 A1 | 3/2003 | Shimoda et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0251461 A1 | 12/2004 | Anzai et al. |
| 2005/0017302 A1 | 1/2005 | Hoffman |
| 2005/0199959 A1 | 9/2005 | Chiang et al. |
| 2005/0243595 A1 | 11/2005 | Rinerson et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0061333 A1 * | 3/2008 | Hidaka ............... 257/295 |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315193 A1 | 12/2008 | Kim et al. |
| 2009/0002590 A1 | 1/2009 | Kimura |
| 2009/0008638 A1 | 1/2009 | Kang et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0230435 A1 | 9/2009 | Maejima |
| 2009/0278122 A1 | 11/2009 | Hosono et al. |
| 2009/0280600 A1 | 11/2009 | Hosono et al. |
| 2010/0065842 A1 | 3/2010 | Yamazaki et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0117076 A1 | 5/2010 | Akimoto et al. |
| 2010/0123136 A1 * | 5/2010 | Lee et al. ............... 257/59 |
| 2010/0148171 A1 | 6/2010 | Hayashi et al. |
| 2010/0193785 A1 | 8/2010 | Kimura |
| 2010/0224880 A1 | 9/2010 | Kimura |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0057918 A1 * | 3/2011 | Kimura et al. ............... 345/211 |
| 2011/0114946 A1 * | 5/2011 | Saito ............... 257/43 |
| 2011/0147737 A1 | 6/2011 | Yamazaki et al. |
| 2011/0156027 A1 * | 6/2011 | Yamazaki et al. ............... 257/43 |
| 2011/0156117 A1 | 6/2011 | Yamazaki et al. |
| 2011/0207251 A1 | 8/2011 | Anzai et al. |
| 2014/0291676 A1 | 10/2014 | Kimura |

FOREIGN PATENT DOCUMENTS

| | | |
|---|---|---|
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-338599 A | 12/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-319682 A | 10/2002 |
| JP | 2003-086000 A | 3/2003 |
| JP | 2003-086808 A | 3/2003 |
| JP | 2004-103957 A | 4/2004 |

(56) References Cited

FOREIGN PATENT DOCUMENTS

| | | |
|---|---|---|
| JP | 2004-273614 A | 9/2004 |
| JP | 2004-273732 A | 9/2004 |
| JP | 2007-073701 A | 3/2007 |
| JP | 2007-208178 A | 8/2007 |
| JP | 2007-220818 A | 8/2007 |
| JP | 2007-220818 A | 8/2007 |
| JP | 2007-305658 A | 11/2007 |
| JP | 2008-072025 A | 3/2008 |
| JP | 2009-135350 A | 6/2009 |
| JP | 2009-167087 A | 7/2009 |
| JP | 2010-232645 A | 10/2010 |
| JP | 2010-232652 A | 10/2010 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFe2O4, and YB2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUs on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

(56) References Cited

OTHER PUBLICATIONS

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

Sanghun Jeon et al.; "180nm Gate Length Amorphous InGaZnO Thin Film Transistor for High Density Image Sensor"; IEDM 10: Technical Digest of International Electron Devices Meeting; Dec. 6-8, 2010; pp. 504-507.

Yang-Shun Fan et al.; "Indium—Gallium—Zinc—Oxide Based Resistive Switching Memory for System-on-Glass Application"; Proceedings of IDW '11, The 18th International Display Workshops; Dec. 7-9, 2011; pp. 575-577.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

K. Lee et al.; "Direction-oriented quasiparticle injection and microwave emission in an ErBa2Cu3Oy superconductor"; Appl. Phys. Lett. (Applied Physics Letters), vol. 74, No. 16; pp. 2375-2377; Apr. 19, 1999.

Sanghyun Lee et al.; "Antiferromagnetic ordering in Li2MnO3 single crystals with a two-dimensional honeycomb lattice"; Journal of Physics: Condensed Matter, vol. 24, No. 45; pp. 456004-1-456004-9; Nov. 14, 2012.

(56) References Cited

OTHER PUBLICATIONS

T. Plecenik et al.; "Effect of crystallographic anisotropy on the resistance switching phenomenon in perovskites"; J. Appl. Phys. (Journal of Applied Physics), vol. 111, pp. 056106-1-056106-3; 2012.

Chinese Office Action (Application No. 201110462046.1) Dated Jun. 30, 2015.

Beena.D et al., "Photoluminescence in laser ablated nanostructured indium oxide thin films", Optoelectronics and Advanced Materials—Rapid Communications, Jan. 2011, vol. 5, No. 1, pp. 1-11.

Jo.G et al., "Structural and electrical characterization of intrinsic n-type In2O3 nanowires", Colloids and Surfaces A, 2008, vol. 311-314, pp. 308-311, Elsevier.

\* cited by examiner

CAPACITOR AND SEMICONDUCTOR DEVICE HAVING OXIDE SEMICONDUCTOR

BACKGROUND OF THE INVENTION

1. Field of the Invention

The present invention relates to a semiconductor device using a semiconductor element and a method for driving the semiconductor device.

2. Description of the Related Art

Storage devices using semiconductor elements are broadly classified into two categories: a volatile device that loses stored data when power supply stops, and a non-volatile device that retains stored data even when power is not supplied.

A typical example of a volatile storage device is a DRAM (dynamic random access memory). A DRAM stores data in such a manner that a transistor included in a storage element is selected and charge is stored in a capacitor.

When data is read from a DRAM, electric charge in a capacitor is lost on the above principle; thus, another writing operation is necessary every time data is read. Moreover, since leakage current (off-state current) flows between a source and a drain of a transistor included in a memory element when the transistor is in an off state, charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for holding of charge in the floating gate or removal of the charge, and a circuit for generating high voltage is also necessary. Further, it takes a relatively long time to hold or remove electric charge, and it is not easy to perform writing and erasing at higher speed.

REFERENCE

[Patent Document 1] Japanese Published Patent Application No. S57-105889

SUMMARY OF THE INVENTION

In view of the above problem, it is an object of an embodiment of the present invention to provide a novel semiconductor device which can hold data even when power is not supplied in a data storing time, and which does not have a limitation on the number of writing operations.

In the present invention, a semiconductor device is formed using a material which allows a sufficient reduction in off-state current of a transistor; for example, an oxide semiconductor material, which is a wide-gap semiconductor, is used. The use of the semiconductor material which allows a sufficient reduction in off-state current of a transistor makes it possible to hold data for a long period. Further, an oxide semiconductor material has high permittivity; thus, the use of the oxide semiconductor material for a dielectric of a capacitor enables an increase in capacitance per unit area.

An embodiment of the present invention is a semiconductor device including a transistor and a capacitor. The transistor includes a gate electrode, a gate insulating layer over the gate electrode, a first oxide semiconductor layer overlapping with gate electrode, over the gate insulating layer, and a source electrode and a drain electrode over and electrically connected to the first oxide semiconductor layer. The capacitor includes a first electrode formed of the same conductive layer as the source electrode or the drain electrode, a second oxide semiconductor layer in contact with the first electrode, and a second electrode in contact with the second oxide semiconductor layer.

Another embodiment of the present invention is a semiconductor device including a transistor and a capacitor. The transistor includes a gate electrode, a gate insulating layer over the gate electrode, a first oxide semiconductor layer overlapping with the gate electrode, over the gate insulating layer, a source electrode and a drain electrode over and electrically connected to the first oxide semiconductor layer, an insulating layer over the first oxide semiconductor layer, the source electrode, and the drain electrode, and an electrode overlapping with the first oxide semiconductor layer, over the insulating layer. The capacitor includes a first electrode, a second oxide semiconductor layer in contact with the first electrode, and a second electrode in contact with the second oxide semiconductor layer and formed of the same conductive layer as the source electrode or the drain electrode.

Another embodiment of the present invention is a semiconductor device including a transistor and a capacitor. The transistor includes a source electrode and a drain electrode, a first oxide semiconductor layer over and electrically connected to the source electrode and the drain electrode, a gate insulating layer over the first oxide semiconductor layer, and a gate electrode overlapping with the first oxide semiconductor layer, over the gate insulating layer. The capacitor includes a first electrode formed of the same conductive layer as the source electrode or the drain electrode, a second oxide semiconductor layer in contact with the first electrode, and a second electrode in contact with the second oxide semiconductor layer.

A metal oxide layer may be formed between the first electrode and the second oxide semiconductor layer.

Further, a metal oxide layer may be formed between the second electrode and the second oxide semiconductor layer.

The gate electrode may include an In—Ga—Zn—O—N-based compound conductor.

The second oxide semiconductor layer may include one or more elements of silicon, germanium, cerium, titanium, tungsten, aluminum, copper, yttrium, lanthanum, and vanadium at a concentration higher than or equal to $1 \times 10^{20}$ atoms/cm$^3$.

The first oxide semiconductor layer and the second oxide semiconductor layer may include an oxide semiconductor which is a non-single-crystal and includes a triangular or hexagonal atomic arrangement when seen from an a-b plane and a phase where metal atoms are arranged in a layered manner or metal atoms and oxygen atoms are arranged in a layered manner in a c-axis direction, or may include an oxynitride semiconductor which is a non-single-crystal and includes a triangular or hexagonal atomic arrangement when seen from an a-b plane and a phase where metal atoms are arranged in a layered manner or metal atoms and oxygen atoms are arranged in a layered manner in a c-axis direction.

Further, the semiconductor device may include a transistor, a capacitor, and a driver circuit formed using a material other than an oxide semiconductor.

Note that although the transistor may be formed using an oxide semiconductor as described above, the present invention is not limited thereto. A material having off-state current characteristics equivalent to those of the oxide semiconductor, for example, a semiconductor material whose energy gap $E_g$ is more than 3 eV (specifically, for example, a wide-gap material such as silicon carbide) may be used.

Note that the term such as "over" or "below" in this specification and the like does not necessarily mean that a component is placed "directly on" or "directly under" another component. For example, the expression "a gate electrode over a gate insulating layer" can mean the case where there is an additional component between the gate insulating layer and the gate electrode.

In addition, the term such as "electrode" or "wiring" in this specification and the like does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that the term "electrically connected" in this specification and the like includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and elements with a variety of functions as well as an electrode and a wiring.

The off-state current of a transistor including an oxide semiconductor is extremely low and thus stored data can be stored for an extremely long time by using the transistor. In other words, power consumption can be reduced because refresh operation becomes unnecessary or the frequency of refresh operation can be extremely low. Moreover, stored data can be held for a long time even when power is not supplied, but note that potentials are preferably fixed.

An oxide semiconductor material has high permittivity; thus, the use of the oxide semiconductor material for a dielectric of a capacitor enables an increase in capacitance per unit area. Consequently, the area of the capacitor can be reduced, so that high integration is possible and a semiconductor device can be miniaturized. In addition, the frequency of refresh operations can be further reduced and thus power consumption can be further reduced.

Further, a semiconductor device according to one embodiment of the present invention does not need high voltage for data writing and there is no problem of deterioration of elements. For example, unlike a conventional non-volatile memory, it is not necessary to inject and extract electrons into and from a floating gate and thus a problem such as deterioration of a gate insulating layer does not occur at all. In other words, the semiconductor device according to one embodiment of the present invention does not have a limit on the number of writing times which is a problem in a conventional nonvolatile memory, and reliability thereof is drastically improved. Furthermore, data is written depending on the on state and the off state of the transistor, whereby high-speed operation can be easily realized. In addition, there is no need of operation for erasing data.

Further, a transistor containing a material other than an oxide semiconductor can operate at sufficiently high speed; thus, by using the transistor, a variety of circuits (e.g., a logic circuit or a driver circuit) in which high-speed operation is needed can be favorably realized.

Accordingly, a semiconductor device having a novel feature can be formed by being provided with both a peripheral circuit such as a driver circuit including a transistor formed using a material other than an oxide semiconductor (a transistor which can operate at higher speed than a transistor including an oxide semiconductor) and a memory circuit including a transistor using an oxide semiconductor and a capacitor using an oxide semiconductor.

DETAILED DESCRIPTION OF THE INVENTION

Figure 1A:
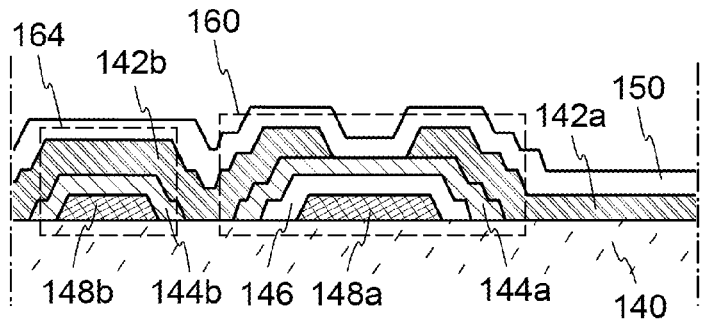
FIGS. 1A to 1D are cross-sectional views of semiconductor devices.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

DETAILED DESCRIPTION OF THE INVENTION

Embodiment 1

In this embodiment, a structure and a manufacturing method of a semiconductor device according to one embodiment of the present invention will be described with reference to FIGS. 1A to 1D, FIGS. 2A to 2D, and FIGS. 3A to 3C.

<Cross-Sectional Structure of Semiconductor Device>

FIGS. 1A to 1D are structure examples of semiconductor devices. FIGS. 1A to 1D illustrate cross sections of the semiconductor devices. The semiconductor devices shown in FIGS. 1A and 1C each include a transistor 160 whose channel formation region includes an oxide semiconductor and a capacitor 164 whose dielectric includes an oxide semiconductor. The semiconductor devices shown in FIGS. 1B and 1D each include a transistor 162 whose channel formation region includes an oxide semiconductor and the capacitor 164 whose dielectric includes an oxide semiconductor.

Although all the transistors are described as n-channel transistors here, it is needless to say that p-channel transistors can be used. Since the technical nature of the disclosed invention is to use an oxide semiconductor in the transistor 160, the transistor 162, and the capacitor 164 so that data can be stored, it is not necessary to limit a specific structure of a semiconductor device to the structure described here.

The transistor 160 in FIG. 1A includes a gate electrode 148a provided over an insulating layer 140, a gate insulating layer 146 covering the gate electrode 148a, a first oxide semiconductor layer 144a overlapping with the gate electrode 148a, over the gate insulating layer 146, and a source or drain electrode 142b and a drain or source electrode 142a which are over and electrically connected to the first oxide semiconductor layer 144a. Note that the transistor 160 is not necessarily formed over the insulating layer 140 and may be formed over a substrate having an insulating surface.

The capacitor 164 in FIG. 1A includes a first electrode 148b, a second oxide semiconductor layer 144b in contact with the first electrode 148b, and the source or drain electrode 142b in contact with the second oxide semiconductor layer 144b. The source or drain electrode 142b here serves as a second electrode of the capacitor 164.

In other words, the capacitor 164 includes the first electrode 148b, the second oxide semiconductor layer 144b, and the second electrode, and the second electrode is formed using the same conductive layer as the source or drain electrode 142b.

Note that the work function of the first electrode 148b is preferably higher than the electron affinity of the second oxide semiconductor layer 144b. For example, in the case where an In—Ga—Zn—O-based oxide is used for the second oxide semiconductor layer 144b, the electron affinity thereof is approximately 4.6 eV. In this case, indium nitride, zinc nitride, nickel, molybdenum oxide, tungsten oxide, an In—Ga—Zn—O—N-based compound conductor, or the like can be used as a material having a work function higher than the electron affinity of the second oxide semiconductor layer 144b.

When the value obtained by evaluating the expression (the work function of the first electrode 148b)–(the electron affinity of the second oxide semiconductor layer 144b) is greater than or equal to 0.5 eV, preferably greater than or equal to 1 eV, electrons generally do not enter the second oxide semiconductor layer 144b. That is, the second oxide semiconductor layer 144b has an enough insulating property and thus can be used for a capacitor.

Even when the value obtained by evaluating the expression (the work function of the first electrode 148b)–(the electron affinity of the second oxide semiconductor layer 144b) is greater than or equal to 0.5 eV, electrons might enter the second oxide semiconductor layer 144b from the source or drain electrode 142b, in some cases, depending on the material of the source or drain electrode 142b. This phenomenon can occur when the work function of the source or drain electrode 142b is smaller than the electron affinity of the second oxide semiconductor layer 144b. Even in this case, a capacitor can function without causing a flow of electrons, depending on the voltage and the polarity of the voltage applied to the first electrode 148b and the source or drain electrode 142b. However, when the source or drain electrode 142b is formed using any of the materials given as the material of the first electrode 148b or a material with a work function higher than or equal to that of the first electrode 148b, a capacitor can function regardless of the voltage and the polarity of the voltage.

Here, the first oxide semiconductor layer 144a and the second oxide semiconductor layer 144b are preferably highly purified by sufficient removal of impurities such as hydrogen. Further, defect levels in an energy gap are preferably reduced by sufficient supply of oxygen. Specifically, the hydrogen concentration in the first oxide semiconductor layer 144a and the second oxide semiconductor layer 144b is lower than or equal to $5\times10^{19}$ atoms/cm$^3$, preferably lower than or equal to $5\times10^{18}$ atoms/cm$^3$, further preferably lower than or equal to $5\times10^{17}$ atoms/cm$^3$, for example. Note that in the following, the hydrogen concentrations in the first oxide semiconductor layer 144a and the second oxide semiconductor layer 144b were measured by secondary ion mass spectroscopy (SIMS). In the first oxide semiconductor layer 144a and the second oxide semiconductor layer 144b which are highly purified by a sufficient reduction in hydrogen concentration and in which defect levels in the energy gap due to oxygen deficiency are reduced by a sufficient supply of oxygen, the carrier concentration is less than $1\times10^{12}/cm^3$, preferably less than $1\times10^{11}/cm^3$, more preferably less than $1.45\times10^{10}/cm^3$. For example, the off-state current (a value obtained by dividing the off-state current by the channel width of the transistor) at room temperature is approximately 10 zA/μm to 100 zA/μm (1 zA (zeptoampere)=$1\times10^{-21}$ A). In this manner, by using an i-type (intrinsic) or substantially i-type oxide semiconductor, the transistor 160 which has extremely favorable off-state current characteristics can be obtained.

In addition, in the case where an oxide semiconductor layer is i-type (intrinsic) or substantially i-type, the permittivity can be increased. Specifically, the relative permittivity of an In—Ga—Zn—O-based oxide semiconductor layer can be approximately 15. This value is high enough as compared to the relative permittivity of silicon oxide, approximately 4. Thus, an i-type or substantially i-type oxide semiconductor layer is used for a dielectric of the capacitor 164, so that the capacitance of the capacitor 164 per unit area can be increased.

The oxide semiconductor layer is in a single crystal state, a polycrystalline (also referred to as polycrystal) state, an amorphous state, or the like.

The oxide semiconductor layer is preferably a CAAC-OS (c-axis aligned crystalline oxide semiconductor) layer.

The CAAC-OS layer is not completely a single crystal nor completely amorphous. The CAAC-OS layer is an oxide semiconductor layer with a crystal-amorphous mixed phase structure where crystal portions are included in an amorphous phase. Note that in most cases, the crystal portions fit inside a cube whose one side is less than 100 nm. From an observation image obtained with a transmission electron microscope (TEM), a boundary between an amorphous portion and a crystal portion in the CAAC-OS layer is not clear. Further, with the TEM, a grain boundary in the CAAC-OS layer is not found. Thus, in the CAAC-OS layer, a reduction in electron mobility, due to the grain boundary, is suppressed.

In each of the crystal portions included in the CAAC-OS layer, a c-axis is aligned in a direction parallel to a vector normal to a surface where the CAAC-OS layer is formed or to a vector normal to a surface of the CAAC-OS layer, triangular or hexagonal atomic arrangement when seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°.

In the CAAC-OS layer, distribution of crystal portions is not necessarily uniform. For example, in the formation process of the CAAC-OS layer, in the case where crystal growth occurs from a surface side of the oxide semiconductor layer, the proportion of crystal portions in the vicinity of the surface of the oxide semiconductor layer is higher than that in the vicinity of the surface where the oxide semiconductor layer is formed in some cases. Further, when an impurity is added to the CAAC-OS layer, the crystal portion in a region to which the impurity is added becomes amorphous in some cases.

Since the c-axes of the crystal portions included in the CAAC-OS layer are aligned in the direction parallel to a vector normal to a surface where the CAAC-OS layer is formed or to a vector normal to a surface of the CAAC-OS layer, the directions of the c-axes may be different from each other depending on the shape of the CAAC-OS layer (the cross-sectional shape of the surface where the CAAC-OS layer is formed or the cross-sectional shape of the surface of the CAAC-OS layer). Note that when the CAAC-OS layer is formed, the direction of c-axis of the crystal portion is the direction parallel to a vector normal to the surface where the CAAC-OS layer is formed or a vector normal to the surface of the CAAC-OS layer. The crystal portion is formed by film formation or by performing treatment for crystallization such as heat treatment after film formation.

With use of the CAAC-OS layer in a transistor, change in electric characteristics of the transistor due to irradiation with visible light or ultraviolet light can be reduced. Thus, the transistor has high reliability.

Further, nitrogen may be substituted for part of oxygen included in the oxide semiconductor layer.

In addition, the second oxide semiconductor layer 144b may contain oxygen so that the proportion of oxygen is higher than that in the stoichiometric composition. Further, the second oxide semiconductor layer 144b may include one or more of the following elements: silicon and germanium, and metals such as cerium, titanium, tungsten, aluminum, copper, yttrium, lanthanum, and vanadium. These elements help to improve the insulating property of the second oxide semiconductor layer 144b.

The concentration of the silicon, germanium, and/or the metal element is higher than or equal to $1\times10^{20}$ atoms/cm$^3$, preferably higher than or equal to $1\times10^{21}$ atoms/cm$^3$, further preferably higher than or equal to $5\times10^{21}$ atoms/cm$^3$.

Note that each end of the gate electrode 148a, the first electrode 148b, the gate insulating layer 146, the first oxide semiconductor layer 144a, and the second oxide semiconductor layer 144b is preferably tapered in the transistor 160 and the capacitor 164. Here, a taper angle is, for example, greater than or equal to 30° and less than or equal to 60°. Note that a "taper angle" means an inclination angle formed by a side surface and a bottom surface of a layer having a tapered shape (e.g., the gate electrode 148a) when observed in the direction perpendicular to the cross section (a plane which is perpendicular to the surface of the substrate) of the layer. Each end of the gate electrode 148a, the first electrode 148b, the gate insulating layer 146, the first oxide semiconductor layer 144a, and the second oxide semiconductor layer 144b is tapered, so that coverage with the source or drain electrode 142b and the drain or source electrode 142a can be improved and thus disconnection can be prevented.

An insulating layer 150 is provided over the transistor 160 and the capacitor 164.

Figure 1B:
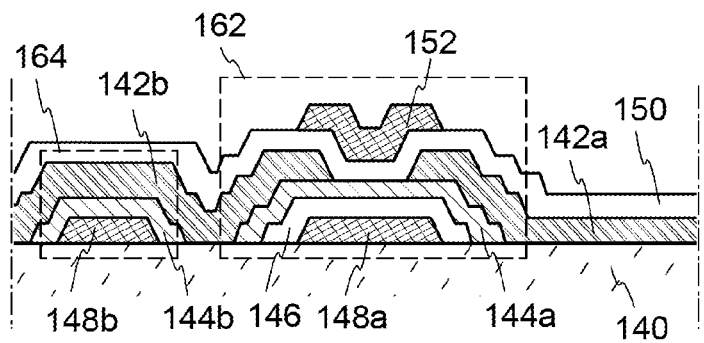

The transistor 162 and the capacitor 164 in FIG. 1B are modified examples of the transistor 160 and the capacitor 164 in FIG. 1A.

The structure in FIG. 1B is different from the structure in FIG. 1A in that the transistor 162 in FIG. 1B includes an electrode 152 over the insulating layer 150. The transistor 162 is a dual-gate transistor in which gate electrode layers are provided over and below the first oxide semiconductor layer 144a having a channel formation region, with insulating layers provided between the first oxide semiconductor layer 144a and the gate electrode layers. Specifically, the transistor 162 includes the gate electrode 148a; the gate insulating layer 146 over the gate electrode 148a; the first oxide semiconductor layer 144a overlapping with the gate electrode 148a, over the gate insulating layer 146; and the source or drain electrode 142b and the drain or source electrode 142a over and electrically connected to the first oxide semiconductor layer 144a. The transistor 162 further includes the insulating layer 150 over the first oxide semiconductor layer 144a, the source or drain electrode 142b, and the drain or source electrode 142a; and the electrode 152 overlapping with the first oxide semiconductor layer 144a, over the insulating layer 150.

The gate electrode 148a and the electrode 152 serve as gate electrodes in FIG. 1B. The potential of the electrode 152 may be the same as or different from that of the gate electrode 148a. The potential of the electrode 152 may be GND or 0V, or the electrode 152 may be in a floating state. By using the gate electrode 148a and the electrode 152, it is possible to control the electric field applied to the first oxide semiconductor layer 144a and thus the threshold voltage of the transistor 162 can be controlled.

Figure 1C:
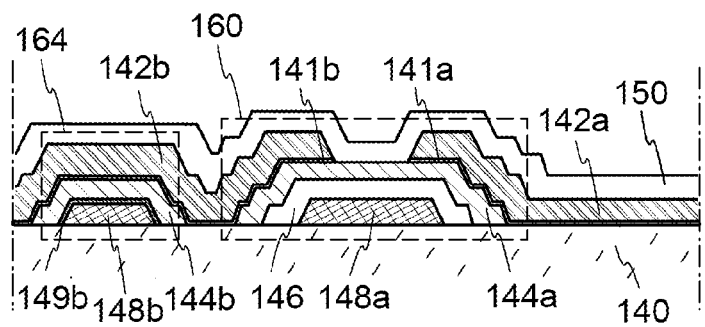

The transistor 160 and the capacitor 164 in FIG. 1C are modified examples of the transistor 160 and the capacitor 164 in FIG. 1A.

The structure in FIG. 1C is different from the structure in FIG. 1A in that the capacitor 164 in FIG. 1C includes a metal oxide layer 149b on a surface of the first electrode 148b, which is in contact with the second oxide semiconductor layer 144b, and the capacitor 164 in FIG. 1C includes a metal oxide layer 141b on a surface of the source or drain electrode 142b, which is in contact with the second oxide semiconductor layer 144b. The transistor 160 in FIG. 1C may further include a metal oxide layer 141a on a surface where the drain or source electrode 142a is in contact with the first oxide semiconductor layer 144a.

In the case where the second oxide semiconductor layer 144b is in contact with the first electrode 148b, the second oxide semiconductor layer 144b might be deprived of oxygen by the first electrode 148b. When the second oxide semiconductor layer 144b is deprived of oxygen, oxygen deficiency in the second oxide semiconductor layer 144b is increased. The second oxide semiconductor layer 144b in which oxygen deficiency is increased has higher conductivity, so that there is a possibility that the second oxide semiconductor layer 144b does not serve as a dielectric for the capacitor.

For this reason, the first electrode 148b preferably comprises the metal oxide layer 149b formed to be in contact with the second oxide semiconductor layer 144b. When the first electrode 148b comprises the metal oxide layer 149b, the second oxide semiconductor layer 144b can be prevented from being deprived of oxygen by the first electrode 148b. Further, oxygen can be supplied from the metal oxide layer 149b to the second oxide semiconductor layer 144b, whereby oxygen deficiency in the second oxide semiconductor layer 144b can be further reduced.

The metal oxide layer 141b and the metal oxide layer 141a preferably have high conductivity. With the use of a layer with high conductivity, electrical connection between the capacitor 164 and the transistor 160 can be kept favorable.

In the case where the second oxide semiconductor layer 144b is in contact with the source or drain electrode 142b, the second oxide semiconductor layer 144b might be deprived of oxygen by the source or drain electrode 142b. When the second oxide semiconductor layer 144b is deprived of oxygen, oxygen deficiency in the second oxide semiconductor layer 144b is increased. The second oxide semiconductor layer 144b in which oxygen deficiency is increased has higher conductivity, so that there is a possibility that the second oxide semiconductor layer 144b does not serve as dielectric for a capacitor.

For this reason, the source or drain electrode 142b preferably comprises a metal oxide layer 141b formed to be in contact with the second oxide semiconductor layer 144b. With the metal oxide layer 141b, the second oxide semiconductor layer 144b can be prevented from being deprived of oxygen by the source or drain electrode 142b. Further, the drain or source electrode 142b may comprise the metal oxide layer 141a formed in contact with the first oxide semiconductor layer 144a and formed in the same step as the metal oxide layer 141b. With the metal oxide layer 141b and/or the metal oxide layer 141a, oxygen can be supplied to the second oxide semiconductor layer 144b and/or the first oxide semiconductor layer 144a, so that oxygen deficiency in the second oxide semiconductor layer 144b and/or the first oxide semiconductor layer 144a can be further reduced.

Note that whether the second oxide semiconductor layer 144b is deprived of oxygen or not depends on conditions in the later step and the like. In the case where the second oxide semiconductor layer 144b is not deprived of oxygen, the metal oxide layer 149b and the metal oxide layer 141b are not necessarily formed.

The case where the metal oxide layer 149b and the metal oxide layer 141b are formed in FIG. 1C; however, one embodiment of the present invention is not limited thereto. Either the metal oxide layer 149b or the metal oxide layer 141b may be provided. In the case where either one of the metal oxide layer 149b or the metal oxide layer 141b is provided, capacitance per unit area is further increased, which is preferable.

Figure 1D:
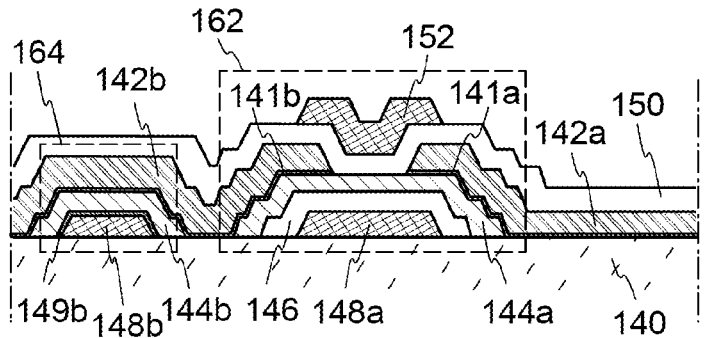

The transistor 162 and the capacitor 164 in FIG. 1D are modified examples of the transistor 160 and the capacitor 164 in FIG. 1C.

The structure in FIG. 1C is different from the structure in FIG. 1D in that the transistor 162 in FIG. 1D includes the electrode 152 over the insulating layer 150. The transistor 162 is a dual-gate transistor in which gate electrode layers are provided over and below a channel region with insulating layers provided between the channel region and the gate electrode layers. Specifically, the transistor 162 includes the gate electrode 148a, the first oxide semiconductor layer 144a over the gate electrode 148a, and the source or drain electrode 142b and the drain or source electrode 142a over and electrically connected to the first oxide semiconductor layer 144a. The transistor 162 further includes the insulating layer 150 over the first oxide semiconductor layer 144a, the source or drain electrode 142b, and the drain or source electrode 142a; and the electrode 152 overlapping with the first oxide semiconductor layer 144a, over the insulating layer 150.

The gate electrode 148a and the electrode 152 serve as gate electrodes in FIG. 1D. The potential of the electrode 152 may be the same as or different from that of the gate electrode 148a. The potential of the electrode 152 may be GND or 0V, or the electrode 152 may be in a floating state. By using the gate electrode 148a and the electrode 152, it is possible to control the electric field applied to the first oxide semiconductor layer 144a and thus the threshold voltage of the transistor 162 can be controlled.

<Manufacturing Method of Semiconductor Device>

Next, manufacturing methods of the transistor 160 and the transistor 162 which are shown in FIGS. 1A and 1B will be described with reference to FIGS. 2A to 2D and FIGS. 3A to 3C.

Figure 2A:
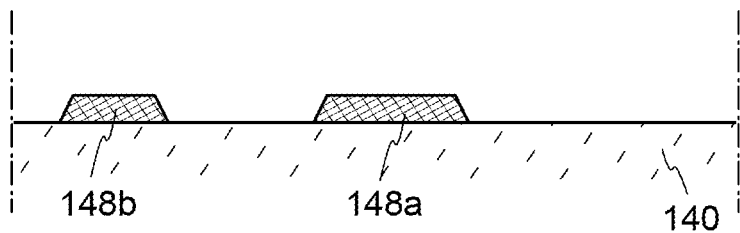
FIGS. 2A to 2D are cross-sectional views illustrating a manufacturing process of a semiconductor device.

First, a conductive layer is formed over the insulating layer 140 and is processed so that the first electrode 148b and the gate electrode 148a are formed (see FIG. 2A).

The insulating layer 140 is formed using a material including an inorganic insulating material such as silicon oxide, silicon oxynitride, silicon nitride oxide, silicon nitride, or aluminum oxide. Alternatively, the insulating layer 140 can be formed using an organic insulating material such as polyimide or acrylic. The insulating layer 140 can be formed to have a single-layer structure or a stacked-layer structure using the above-described material. In this embodiment, the case of using silicon oxide for the insulating layer 140 is described.

Note that the transistor 160 and the transistor 162 are not necessarily formed over the insulating layer 140. For example, the transistor 160 and the transistor 162 may be formed over a substrate having an insulating surface. As the substrate, a glass substrate, an insulating substrate formed using an insulator, such as a ceramic substrate, a quartz substrate, or a sapphire substrate, a semiconductor substrate formed using a semiconductor material such as silicon, a conductive substrate formed using a conductor such as metal or stainless steel, any of these substrates whose surface is covered with an insulating material, or the like can be used. Furthermore, a flexible substrate such as a plastic substrate generally tends to have a low upper temperature limit, but can be used as long as the substrate can withstand processing temperatures in the subsequent manufacturing steps.

The first electrode 148b and the gate electrode 148a can be formed using a metal material such as molybdenum, titanium, tantalum, tungsten, aluminum, copper, neodymium, or scandium, or an alloy material containing any of these materials as a main component. Note that the first electrode 148b and the gate electrode 148a may each be formed with a single-layer structure or a stacked structure. For example, a two-layer structure in which copper is stacked over a copper-magnesium-aluminum alloy layer or a three-layer structure in which molybdenum, aluminum, and molybdenum are stacked in this order may be employed.

The first electrode 148b and the gate electrode 148a may be formed using a material with a high work function, such as an In—Ga—Zn—O—N-based compound conductor. With the use of the material with a high work function, such as an In—Ga—Zn—O—N-based compound conductor, for the gate electrode 148a, electric characteristics of the transistor 160 such as the threshold voltage can be controlled.

Figure 2B:
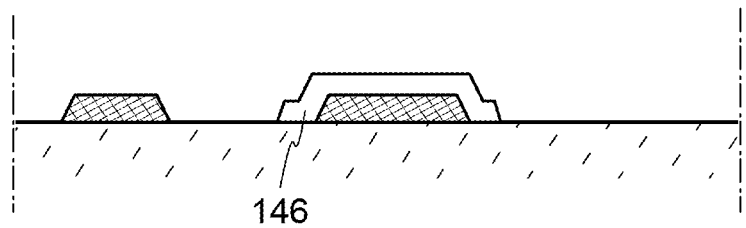

Next, an insulating layer is formed and is processed so that the gate insulating layer 146 covering the gate electrode 148a is formed (see FIG. 2B). The insulating layer is processed and is partly removed so as not to cover the first electrode 148b, so that the second oxide semiconductor layer 144b can be formed in contact with the first electrode 148b later. Accordingly, it is possible that only the second oxide semiconductor layer 144b serves as a dielectric of the capacitor 164. Thus, the dielectric of the capacitor 164 can be formed thinner than a dielectric formed with a stack of an insulating layer and the second oxide semiconductor layer 144b. Since the capacitor 164 is formed thinner, the capacitor 164 can have larger capacitance per unit area.

The insulating layer 146 can be formed by a CVD method, a sputtering method, or the like. The gate insulating layer 146 preferably contains silicon oxide, silicon nitride, silicon oxynitride, aluminum oxide, or the like. The gate insulating layer 146 may have a single-layer structure or a stacked-layer structure including a combination of any of the above materials. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

Alternatively, the gate insulating layer 146 may be formed using an insulating material containing a Group 13 element and oxygen. Many of oxide semiconductor materials include Group 13 elements, and thus an insulating material containing a Group 13 element has a good compatibility with an oxide semiconductor. With the use of such an insulating material containing a Group 13 element for an insulating layer in contact with the oxide semiconductor layer, the condition of an interface between the oxide semiconductor layer and the insulating layer can be kept favorable. An insulating material containing a Group 13 element refers to an insulating material containing one or more Group 13 elements. An insulating material containing a Group 13 element is, for example, aluminum oxide. Note that aluminum oxide has a property of not easily permeating water and thus it is preferable to use aluminum oxide in terms of preventing entry of water to the oxide semiconductor layer.

The insulating layer in contact with the first oxide semiconductor layer 144a preferably contains oxygen in a proportion higher than that in the stoichiometric proportion by heat treatment in an oxygen atmosphere or by addition of oxygen. The addition of oxygen may be performed by doping, an ion implantation method, or an ion doping method. "Doping of oxygen" refers to addition of oxygen into a bulk. Note that the term "bulk" is used in order to clarify that oxygen is added not only to a surface of a thin layer but also to the inside of the thin layer. In addition, "doping of oxygen" includes "oxygen plasma doping" in which oxygen plasma is added to a bulk.

For example, in the case where the insulating layer in contact with the first oxide semiconductor layer 144a is formed using aluminum oxide, the composition of aluminum oxide can be set to be $Al_2O_x$ ($x=3+\alpha$, $0<\alpha<1$) by heat treatment in an oxygen atmosphere or oxygen doping.

By oxygen doping or the like, an insulating layer which includes a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen deficiency in the oxide semiconductor layer subjected to dehydration or dehydrogenation or at the interface between the oxide semiconductor layer and the insulating layer is reduced. Thus, the oxide semiconductor layer can be formed to be an intrinsic (i-type) or substantially intrinsic oxide semiconductor.

Note that an insulating layer including a region where the proportion of oxygen is higher than the stoichiometry may be used as an insulating layer formed as a base layer of the transistor 160 or the insulating layer 150 formed in a later step, instead of the gate insulating layer 146, or may be used as a plurality of them or all of them.

The gate insulating layer 146 is formed to a thickness of greater than or equal to 10 nm and less than or equal to 50 nm using silicon oxide by a sputtering method in this embodiment.

Figure 2C:
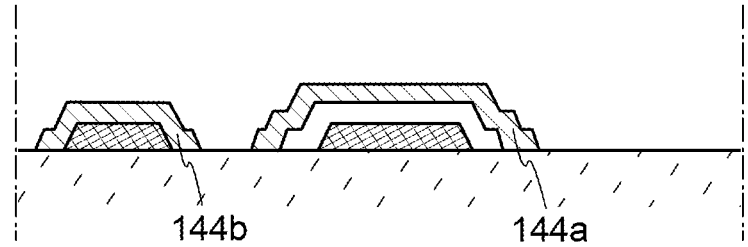

Next, an oxide semiconductor layer is formed and is processed so that the first oxide semiconductor layer 144a overlapping with the gate electrode 148a, over the gate insulating layer 146, is formed. At the same time, the second oxide semiconductor layer 144b is formed in contact with the first electrode 148b or the metal oxide layer 149b (FIG. 2C).

As an oxide semiconductor material used for the oxide semiconductor layer, any of the following metal oxides can be used: an In—Sn—Ga—Zn—O-based oxide which is a four-component metal oxide; an In—Ga—Zn—O-based oxide, an In—Sn—Zn—O-based oxide, an In—Al—Zn—O-based oxide, a Sn—Ga—Zn—O-based oxide, an Al—Ga—Zn—O-based oxide, and a Sn—Al—Zn—O-based oxide which are three-component metal oxides; an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, and an In—Ga—O-based oxide which are two-component oxides; an In—O-based oxide; a Sn—O-based oxide; and a Zn—O-based oxide. In addition, the above materials may contain $SiO_2$. Here, for example, an In—Ga—Zn—O-based oxide means an oxide layer containing indium (In), gallium (Ga), and zinc (Zn), and there is no particular limitation on the composition ratio thereof. Further, the In—Ga—Zn—O-based oxide may contain an element other than In, Ga, and Zn.

The thickness of the oxide semiconductor layer is preferably greater than or equal to 3 nm and less than or equal to 30 nm. This is because the transistor might be normally on when the oxide semiconductor layer is too thick (e.g., when the thickness is greater than or equal to 50 nm). In addition, this is because the capacitance of the capacitor 164 is decreased with a decrease in thickness of the second oxide semiconductor layer 144*b*.

The oxide semiconductor layer is preferably formed by a method whereby impurities such as hydrogen, water, a hydroxyl group, or hydride do not enter the oxide semiconductor layer. For example, the oxide semiconductor layer can be formed by a sputtering method or the like.

In this embodiment, the oxide semiconductor layer is formed by a sputtering method using a target of an In—Ga—Zn-based oxide.

As the target of an In—Ga—Zn—O-based oxide, an oxide target having a composition ratio of $In_2O_3:Ga_2O_3:ZnO=1:1:1$ [molar ratio] can be used, for example. Note that it is not necessary to limit the material and the composition ratio of the target to the above. For example, an oxide target having a composition ratio of $In_2O_3:Ga_2O_3:ZnO=1:1:2$ [molar ratio] can be used.

The relative density of the oxide target is higher than or equal to 90% and lower than or equal to 100%, preferably higher than or equal to 95% and lower than or equal to 99.9%. This is because, with the use of a metal oxide target with a high relative density, a dense oxide semiconductor layer can be formed.

In addition, the oxide semiconductor layer is preferably a CAAC-OS layer. An i-type (intrinsic) or substantially i-type CAAC-OS layer obtained by reduction of impurities and addition of oxygen can be formed as follows, for example.

First, a first oxide semiconductor layer is formed over a substrate by a sputtering method, a molecular beam epitaxy method, an atomic layer deposition method, or a pulsed laser deposition method. The substrate is heated during the formation, whereby the oxide semiconductor layer in which the proportion of a crystal region is higher than that of an amorphous region can be formed. The substrate temperature may be higher than or equal to 150° C. and lower than or equal to 450° C., preferably higher than or equal to 200° C. and lower than or equal to 250° C., for example.

The substrate temperature is increased, whereby the crystallization of the oxide of CAAC-OS can be promoted.

Next, the substrate is preferably subjected to the first heat treatment. The first heat treatment is performed, so that the proportion of a crystal region with respect to an amorphous region in the oxide semiconductor layer can be increased. The first heat treatment may be performed at a temperature higher than or equal to 200° C. and lower than the strain point of the substrate, and is preferably performed at a temperature higher than or equal to 200° C. and lower than or equal to 250° C. The substance containing a hydrogen atom in the oxide semiconductor layer can be further reduced through the heat treatment. The heat treatment is performed in an oxidizing atmosphere, an inert atmosphere, or a reduced-pressure atmosphere; however, there is no limitation on the atmosphere. The treatment time is 3 minutes to 24 hours. As the treatment time is increased, the proportion of a crystal region with respect to an amorphous region in the oxide semiconductor layer can be increased; however, heat treatment for longer than 24 hours is not preferable because the productivity is reduced.

The oxidizing atmosphere is an atmosphere containing an oxidizing gas. Oxidizing gas is oxygen, ozone, nitrous oxide, or the like, and it is preferable that the oxidizing gas does not contain water, hydrogen, and the like. For example, the purity of oxygen, ozone, or nitrous oxide to be introduced to a heat treatment apparatus is greater than or equal to 8N (99.999999%), preferably greater than or equal to 9N (99.9999999%). As the oxidizing atmosphere, an oxidizing gas and an inert gas may be mixed to be used. In that case, the mixture contains an oxidizing gas at a concentration of greater than or equal to 10 ppm.

Here, the inert atmosphere refers to an atmosphere containing an inert gas (such as nitrogen or a rare gas (e.g., helium, neon, argon, krypton, or xenon) as the main component. Specifically, the concentration of a reactive gas such as an oxidizing gas is lower than 10 ppm.

An RTA (Rapid Thermal Anneal) apparatus can be used for the first heat treatment. With the use of an RTA apparatus, heat treatment at a temperature higher than the strain point of the substrate can be performed only for a short time. Consequently, time taken to form an oxide semiconductor layer in which the proportion of a crystal region is higher than that of an amorphous region can be shortened.

As the oxide semiconductor, a material expressed by the chemical formula $InMO_3(ZnO)_m$ (m>0) may be used. Here, M represents one or more metal elements selected from Ga, Al, Mn, and Co. For example, M may be Ga, Ga and Al, Ga and Mn, Ga and Co, or the like.

An In—Ga—Zn—O-based oxide containing nitrogen at a concentration higher than or equal to $5\times10^{19}/cm^3$, preferably higher than or equal to $1\times10^{20}/cm^3$ and lower than 7 atomic % becomes an oxide having a c-axis-aligned hexagonal crystal structure, and has one layer containing Ga and Zn between In—O crystal planes (crystal planes containing indium and oxygen). Alternatively, the In—Ga—Zn—O-based oxide containing nitrogen at the above concentration may have a plurality of layers containing Ga and Zn between the In—O crystal planes.

An oxide stack may be formed by forming a second oxide semiconductor layer over the first oxide semiconductor layer. The first oxide semiconductor layer and the second oxide semiconductor layer can be formed by similar methods.

The second oxide semiconductor layer is formed while the substrate is heated, so that the second oxide semiconductor layer can be crystallized using the first oxide semiconductor layer as a seed crystal.

Note that second heat treatment may be performed after the second oxide semiconductor layer is formed. The second heat treatment may be performed by a method similar to the first heat treatment. The second heat treatment is performed, so that the proportion of a crystal region with respect to an amorphous region in the oxide stack can be increased. Alternatively, the second heat treatment is performed, so that second oxide semiconductor layer can be crystallized using the first oxide semiconductor layer as a seed crystal. At this time, the crystal growth may be homo growth in which the first oxide semiconductor layer and the second oxide semiconductor layer are formed of the same elements. Alternatively, the crystal growth may be hetero growth in which each of the first oxide semiconductor layer and the second oxide semiconductor layer is formed of at least one different element.

The impurities are reduced and oxygen is added through the above steps, so that an i-type or substantially i-type CAAC-OS can be formed. Such an oxide semiconductor layer is formed, whereby a transistor having extremely excellent characteristics can be realized.

In addition, in the case where an oxide semiconductor is i-type (intrinsic) or substantially i-type, the permittivity can be increased. Specifically, the relative permittivity of In—Ga—Zn—O-based oxide can be approximately 15. This value is high enough as compared to the relative permittivity of silicon oxide, approximately 4. Thus, an i-type or substantially i-type oxide semiconductor layer is used for a dielectric of the capacitor 164, so that the capacitance of the capacitor 164 per unit area can be increased.

Further, oxygen may be added to the second oxide semiconductor layer 144*b* after the oxide semiconductor layer is processed so that the first oxide semiconductor layer 144*a* and the second oxide semiconductor layer 144*b* are formed. Further, the second oxide semiconductor layer 144*b* may include one or more of the following elements: silicon and germanium, metals such as cerium, titanium, tungsten, aluminum, copper, yttrium, lanthanum, and vanadium. These elements help to improve the insulating property of the second oxide semiconductor layer 144*b*.

As a method for adding the element, an ion implantation method, an ion doping method, or the like can be used. The addition concentration is, in the case of oxygen, preferably higher than or equal to $1 \times 10^{16}$ atoms/cm$^3$ and lower than or equal to $2 \times 10^{20}$ atoms/cm$^3$. Oxygen in this range of concentration can be added to an oxide semiconductor without creating distortion and the like in a crystal. The concentration of silicon, germanium, and/or the metal element is higher than or equal to $1 \times 10^{20}$ atoms/cm$^3$, preferably higher than or equal to $1 \times 10^{21}$ atoms/cm$^3$, further preferably higher than or equal to $5 \times 10^{21}$ atoms/cm$^3$.

Figure 2D:
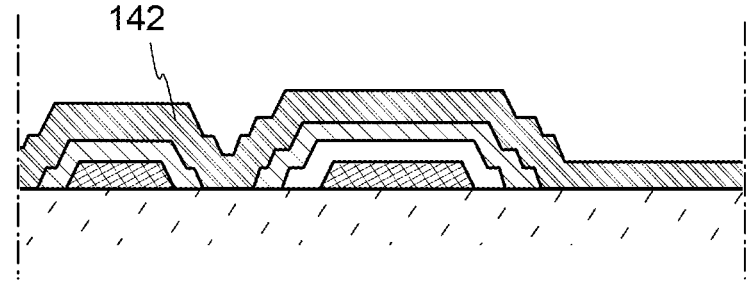

Next, the conductive layer 142 is formed (see FIG. 2D). The conductive layer 142 can be formed using a material and a structure similar to those of the first electrode 148*b* and the gate electrode 148*a*.

Figure 3A:
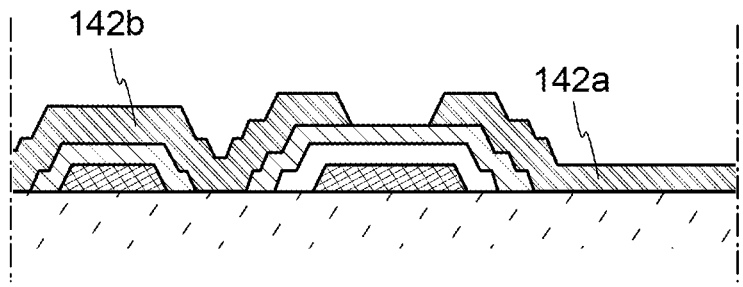
FIGS. 3A to 3C are cross-sectional views illustrating a manufacturing process of a semiconductor device.

Then, the conductive layer 142 is processed so that the source or drain electrode 142*b* and the drain or source electrode 142*a* are formed (see FIG. 3A).

Then, the insulating layer 150 is formed so as to cover the source or drain electrode 142*b*, the drain or source electrode 142*a*, and the first oxide semiconductor layer 144*a*. The insulating layer 150 can be formed using an inorganic insulating material such as silicon oxide, silicon oxynitride, silicon nitride oxide, silicon nitride, or aluminum oxide. It is preferable to use a low dielectric constant (low-k) material for the insulating layer 150 because capacitance due to overlap of electrodes or wirings over the insulating layer 150 can be sufficiently reduced. Note that a porous insulating layer with any of the above materials may be employed as the insulating layer 150. Since the porous insulating layer has low dielectric constant as compared to a dense insulating layer, capacitance due to electrodes or wirings can be further reduced. Moreover, the insulating layer 150 can be formed using an organic insulating material such as polyimide or acrylic. The insulating layer 150 can be formed to have a single-layer structure or a stacked-layer structure using the above-described material (see FIG. 3B).

Figure 3B:
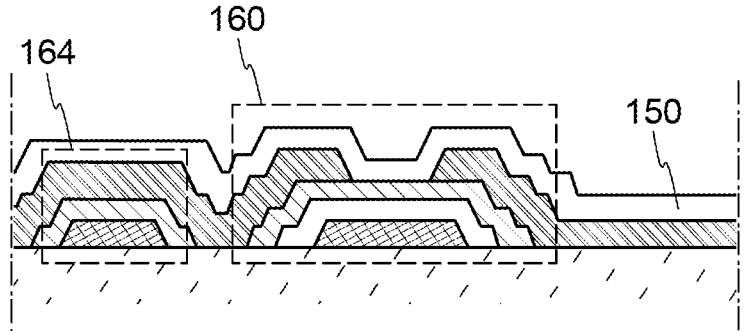

Through the above steps, the transistor 160 including an oxide semiconductor layer and the capacitor 164 are formed (see FIG. 3B).

Further, the electrode 152 may be formed over the insulating layer 150. The electrode 152 can be formed using a material and a structure similar to those of the first electrode 148*b* and the gate electrode 148*a*. With the electrode 152, electric characteristics, such as the threshold voltage, of the transistor 162 can be controlled.

Figure 3C:
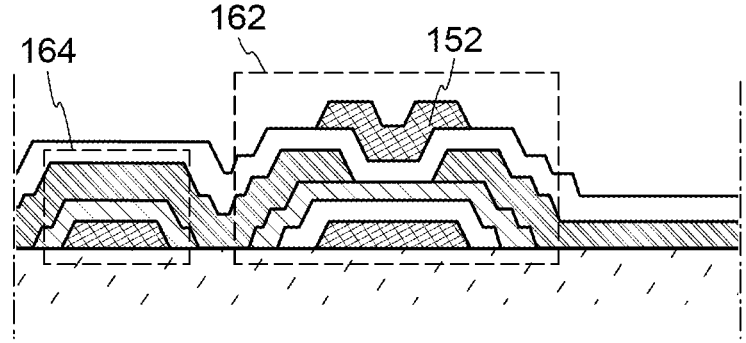

Through the above steps, the transistor 162 including the electrode 152 is completed (see FIG. 3C).

Next, manufacturing methods of the transistor 160 and the transistor 162 shown in FIGS. 1C and 1D will be described.

First, the insulating layer 140 is formed. The description of FIG. 1A can be referred to for the description of the insulating layer 140.

Then, a conductive layer is formed over the insulating layer 140 and is processed so that the first electrode 148*b* and the gate electrode 148*a* are formed. Next, the metal oxide layer 149*b* is formed by oxidizing the first electrode 148*b* or by performing a sputtering method or a CVD method, before the first electrode 148*b* is in contact with an oxide semiconductor layer formed later.

The description of FIG. 1A can be referred to for the material and the structures of the first electrode 148*b* and the gate electrode 148*a*, and in the case where the metal oxide layer 149*b* is formed by high-density oxygen plasma treatment or heat oxidation, the first electrode 148*b* and the gate electrode 148*a* preferably contain tungsten, titanium, or zirconium because these oxides have high conductivity. Alternatively, the metal oxide layer 149*b* may be formed using a layer containing an In—Ga—Zn—O—N-based compound. The metal oxide layer 149*b* may be formed before the insulating layer is formed or after the gate insulating layer 146 is formed. In addition, the metal oxide layer may be stacked over both the first electrode 148*b* and the gate electrode 148*a* or only over the first electrode 148*b*.

There is no limitation on a method of forming the metal oxide layer 149*b*, and for example, the metal oxide layer 149*b* may be formed by high-density oxygen plasma treatment. High-density oxygen plasma treatment is performed using, for example, a mixed gas of a rare gas such as helium, argon, krypton, or xenon and oxygen. In this case, by exciting plasma by introduction of microwaves, plasma with a low electron temperature and a high density can be generated. When a surface of the first electrode 148*b* is oxidized by oxygen radicals (OH radicals may be included) produced by such high-density plasma, the metal oxide layer 149*b* with a thickness in the range of 1 nm to 20 nm, preferably 5 nm to 10 nm can be formed.

The oxidation of the first electrode 148*b* by high-density oxygen plasma treatment is solid phase growth; accordingly, the interface state density between the first electrode 148*b* and the metal oxide layer 149*b* can be extremely reduced. In addition, the first electrode 148*b* is directly oxidized by high-density oxygen plasma treatment and thus thickness variation of the metal oxide layer 149*b* can be suppressed.

Alternatively, the metal oxide layer 149*b* may be formed by performing heat oxidation on the first electrode 148*b*. In the case of such heat oxidation, it is necessary to use a substrate having a certain degree of heat resistance.

Alternatively, the metal oxide layer 149*b* may be formed by processing a layer formed by a sputtering method or a CVD method. A description of a manufacturing method of an oxide semiconductor layer described later can be referred to for a manufacturing method using a sputtering method.

In this embodiment, the metal oxide layer 149*b* with a thickness in the range of 5 nm to 10 nm is formed by high-density oxygen plasma treatment.

With the metal oxide layer 149*b*, the second oxide semiconductor layer 144*b* formed in a later step can be prevented from being deprived of oxygen by the first electrode 148*b*. Further, oxygen can be supplied from the metal oxide layer 149*b* to the second oxide semiconductor layer 144*b* formed in a later step, whereby oxygen deficiency in the second oxide semiconductor layer 144*b* can be further reduced. In addition, with the use of the metal oxide layer 149b with high conductivity, a decrease in capacitance of the capacitor 164 can be suppressed.

Next, an insulating layer is formed and is processed so that the gate insulating layer 146 covering the gate electrode 148a is formed. The description of FIG. 1A can be referred to for the description of the gate insulating layer 146.

Next, an oxide semiconductor layer is formed and is processed so that the first oxide semiconductor layer 144a is formed over the gate insulating layer 146 so as to overlap with the gate electrode 148a. At the same time, the second oxide semiconductor layer 144b is formed in contact with the first electrode 148b or the metal oxide layer 149b. The description of FIG. 1A can be referred to for the description of the oxide semiconductor layer, the first oxide semiconductor layer 144a, and the second oxide semiconductor layer 144b.

Then, a metal oxide layer is formed. The metal oxide layer can be formed by a CVD method, a sputtering method, or the like. The metal oxide layer preferably includes tungsten oxide, titanium oxide, zirconium oxide, or an In—Ga—Zn—O—N-based compound because these metal oxides have high conductivity. There is no particular limitation on the thickness of the metal oxide layer, and for example, the metal oxide layer can be formed with a thickness in the range of 1 nm to 20 nm, preferably 5 nm to 10 nm.

Next, the conductive layer 142 is formed. The conductive layer 142 can be formed using a material and a structure similar to those of the first electrode 148b and the gate electrode 148a. Note that the metal oxide layer is preferably formed before the first oxide semiconductor layer 144a and the second oxide semiconductor layer 144b are in contact with the conductive layer 142.

Then, the conductive layer 142 and the metal oxide layer are processed so that the source or drain electrode 142b, the metal oxide layer 141b, the drain or source electrode 142a, and the metal oxide layer 141a are formed.

With the use of the metal oxide layer 141a having high conductivity, electrical connection between the capacitor 164 and the transistor 160 can be kept favorable. With the metal oxide layer 141b and/or the metal oxide layer 141a, the first oxide semiconductor layer 144a and the second oxide semiconductor layer 144b can be prevented from being deprived of oxygen. Further, oxygen can be supplied from the metal oxide layer 141b and the metal oxide layer 141a to the first oxide semiconductor layer 144a and the second oxide semiconductor layer 144b, so that oxygen deficiency in the first oxide semiconductor layer 144a and the second oxide semiconductor layer 144b can be reduced.

Then, the insulating layer 150 is formed so as to cover the source or drain electrode 142b, the metal oxide layer 141b, the drain or source electrode 142a, the metal oxide layer 141a, and the first oxide semiconductor layer 144a. The insulating layer 150 can be formed with a material and a structure similar to those of the gate insulating layer 146.

Through the above steps, the transistor 160 including an oxide semiconductor layer and the capacitor 164 are formed (see FIG. 1C).

Further, the electrode 152 may be formed over the insulating layer 150. The electrode 152 can be formed using a material and a structure similar to those of the first electrode 148b and the gate electrode 148a. With the electrode 152, electric characteristics, such as the threshold voltage, of the transistor 162 can be controlled.

Through the above steps, the transistor 162 including the electrode 152 is completed (see FIG. 1D).

Embodiment 2

In this embodiment, a structure and a method of manufacturing a semiconductor device, which are different from those of Embodiment 1, will be described with reference to FIGS. 4A and 4B, FIGS. 5A to 5D, FIGS. 6A to 6C, FIGS. 7A and 7B, and FIGS. 8A to 8D.

<Cross-Sectional Structure of Semiconductor Device>

Figure 4A:
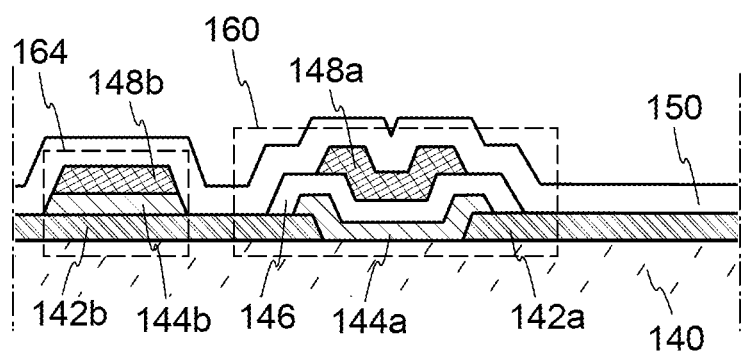
FIGS. 4A and 4B are cross-sectional views of semiconductor devices.
Figure 4B:
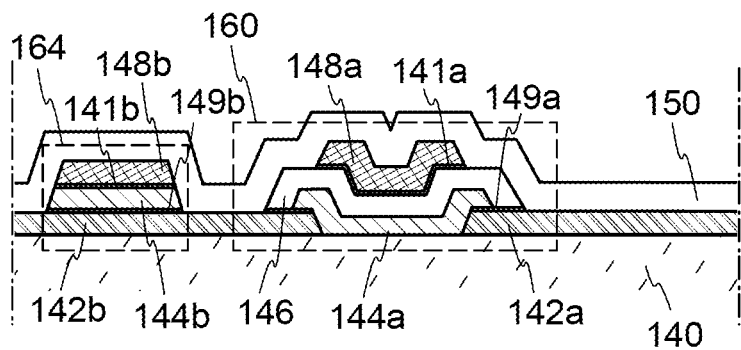

FIGS. 4A and 4B are structural examples of a semiconductor device. FIGS. 4A and 4B illustrate cross sections of the semiconductor device. The semiconductor devices shown in FIGS. 4A and 4B each include the transistor 160 whose channel formation region includes an oxide semiconductor and the capacitor 164 whose dielectric includes an oxide semiconductor.

The transistor 160 in FIG. 4A includes the source or drain electrode 142b and the drain or source electrode 142a which are provided over the insulating layer 140; the first oxide semiconductor layer 144a over and electrically connected to the source or drain electrode 142b and the drain or source electrode 142a; the gate insulating layer 146 covering the first oxide semiconductor layer 144a; and the gate electrode 148a overlapping with the first oxide semiconductor layer 144a, over the gate insulating layer 146.

The capacitor 164 in FIG. 4A includes the source or drain electrode 142b, the second oxide semiconductor layer 144b in contact with the source or drain electrode 142b, and the first electrode 148b in contact with the second oxide semiconductor layer 144b. The source or drain electrode 142b here serves as a second electrode of the capacitor 164.

In other words, the capacitor 164 includes the first electrode 148b, the second oxide semiconductor layer 144b, and the second electrode, and the second electrode is formed using the same conductive layer as the source or drain electrode 142b.

An insulating layer 150 is provided over the transistor 160 and the capacitor 164.

The transistor 160 and the capacitor 164 in FIG. 4B are modified examples of the transistor 160 and the capacitor 164 in FIG. 4A.

The structure in FIG. 4B is different from the structure in FIG. 4A in that the capacitor 164 in FIG. 4B includes the metal oxide layer 149b on a surface of the source or drain electrode 142b, which is in contact with the second oxide semiconductor layer 144b, and the capacitor 164 in FIG. 4B includes the metal oxide layer 141b on a surface of the first electrode 148b, which is in contact with the second oxide semiconductor layer 144b. The transistor 160 in FIG. 4B may further include the metal oxide layer 149a on a surface of the drain or source electrode 142a, which is in contact with the first oxide semiconductor layer 144a.

In the case where the second oxide semiconductor layer 144b is in contact with the source or drain electrode 142b, the second oxide semiconductor layer 144b might be deprived of oxygen by the source or drain electrode 142b. When the second oxide semiconductor layer 144b is deprived of oxygen, oxygen deficiency in the second oxide semiconductor layer 144b is increased. The second oxide semiconductor layer 144b in which oxygen deficiency is increased has higher conductivity, so that there is a possibility that the second oxide semiconductor layer 144b does not serve as dielectric for a capacitor.

For this reason, the source or drain electrode 142b preferably comprises the metal oxide layer 149b formed to be in contact with the second oxide semiconductor layer 144b. With the metal oxide layer 149b, the second oxide semiconductor layer 144b can be prevented from being deprived of oxygen by the second oxide semiconductor layer 144b. Further, the drain or source electrode 142a may comprise the metal oxide layer 149a formed to be in contact with the first oxide semiconductor layer 144a. With the metal oxide layer 149b and/or the metal oxide layer 149a, oxygen can be supplied to the second oxide semiconductor layer 144b, whereby oxygen deficiency in the second oxide semiconductor layer 144b can be further reduced.

In the case where the second oxide semiconductor layer 144b is in contact with the first electrode 148b, the second oxide semiconductor layer 144b might be deprived of oxygen by the first electrode 148b. When the second oxide semiconductor layer 144b is deprived of oxygen, oxygen deficiency in the second oxide semiconductor layer 144b is increased. The second oxide semiconductor layer 144b in which oxygen deficiency is increased has higher conductivity, so that there is a possibility that the second oxide semiconductor layer 144b does not serve as dielectric for a capacitor.

For this reason, the first electrode 148b preferably comprises the metal oxide layer 141b formed to be in contact with the second oxide semiconductor layer 144b and. With the metal oxide layer 141b, the second oxide semiconductor layer 144b can be prevented from being deprived of oxygen by the source or drain electrode 142b. Further, the metal oxide layer 141a between the gate insulating layer 146 and the gate electrode 148a may be formed in the same step as the metal oxide layer 141b.

Note that whether the second oxide semiconductor layer 144b is deprived of oxygen or not depends on conditions in the later step and the like. In the case where the second oxide semiconductor layer 144b is not deprived of oxygen, the metal oxide layer 149b and the metal oxide layer 141b are not necessarily formed.

<Manufacturing Method of Semiconductor Device>

Next, manufacturing methods of the transistor 160 shown in FIG. 4A will be described with reference to FIGS. 5A to 5D and FIGS. 6A to 6C.

Figure 5A:
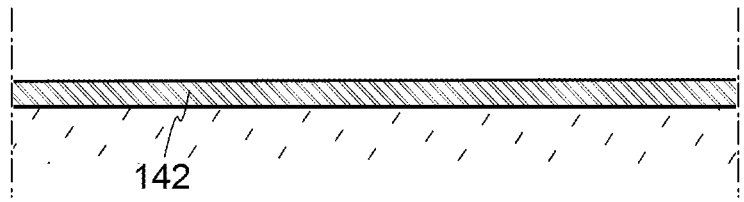
FIGS. 5A to 5D are cross-sectional views illustrating a manufacturing process of a semiconductor device.

First, the conductive layer 142 is formed over the insulating layer 140 (see FIG. 5A).

The description in Embodiment 1 can be referred to for the material and the structure of the conductive layer 142.

Figure 5B:
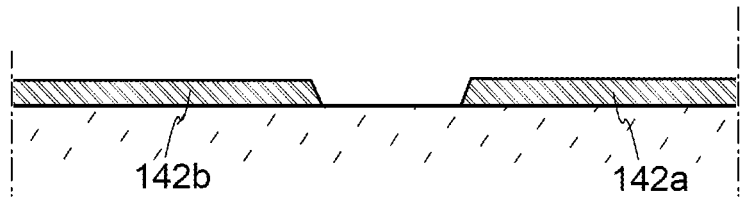
Figure 5C:
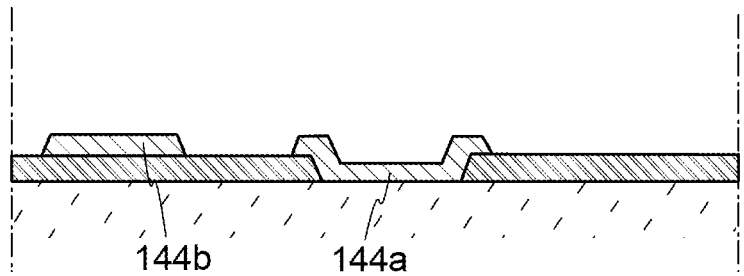

Then, the conductive layer 142 is processed so that the source or drain electrode 142b and the drain or source electrode 142a are formed (see FIG. 5B).

Then, an oxide semiconductor layer is formed and is processed so that the first oxide semiconductor layer 144a electrically connected to the source or drain electrode 142b and the drain or source electrode 142a is formed. At the same time, the oxide semiconductor layer is processed so that the second oxide semiconductor layer 144b in contact with the source or drain electrode 142b is formed (see FIG. 5C). At this time, first heat treatment is preferably performed. The description in Embodiment 1 can be referred to for the material and the structure of the oxide semiconductor layer and the first heat treatment.

Figure 5D:
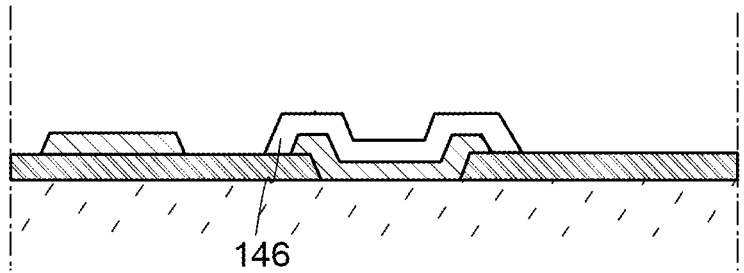

Next, an insulating layer is formed over the first oxide semiconductor layer 144a and is processed so that the gate insulating layer 146 is formed (see FIG. 5D). The description in Embodiment 1 can be referred to for the material and the structure of the gate insulating layer 146.

After formation of the insulating layer, second heat treatment is preferably performed in an inert gas atmosphere or an oxygen atmosphere. The second heat treatment may be performed by the method similar to that of the first heat treatment. In the case where the insulating layer contains oxygen, oxygen is supplied to the first oxide semiconductor layer 144a and the second oxide semiconductor layer 144b to cover oxygen deficiency in the first oxide semiconductor layer 144a and the second oxide semiconductor layer 144b, so that i-type (intrinsic) or substantially i-type oxide semiconductor layers can be formed.

As described above, by employing at least one of the first heat treatment and the second heat treatment, the oxide semiconductor layers can be highly purified so as to contain the substance including hydrogen atoms as little as possible.

Note that the second heat treatment is performed after the formation of the insulating layer in this embodiment; however, there is no particular limitation on the timing of the second heat treatment. For example, the second heat treatment may be performed after the insulating layer is processed so that the gate insulating layer 146 is formed. Alternatively, the first heat treatment and the second heat treatment may be successively performed, the first heat treatment may also serve as the second heat treatment, or the second heat treatment may also serve as the first heat treatment.

In addition, the second oxide semiconductor layer 144b may be doped with oxygen. When oxygen doping is performed on the second oxide semiconductor layer 144b, the second oxide semiconductor layer 144b can be made to be closer to i-type. The description of the gate insulating layer in Embodiment 1 can be referred to for the oxygen doping method.

Figure 6A:
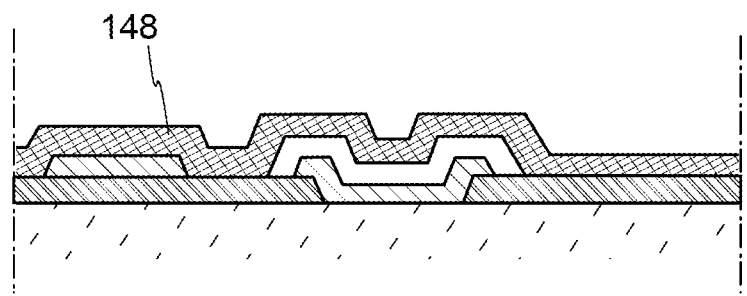
FIGS. 6A to 6C are cross-sectional views illustrating a manufacturing process of a semiconductor device.
Figure 6B:
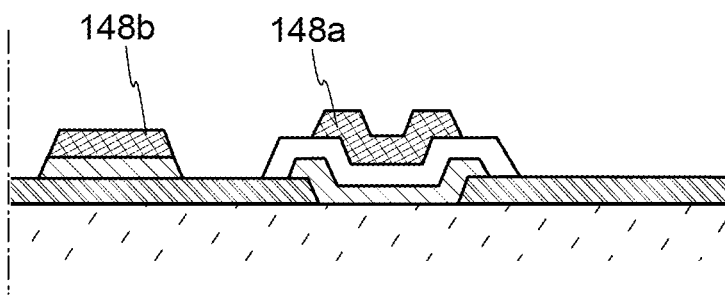

Next, the conductive layer 148 is formed (FIG. 6A). The description in Embodiment 1 can be referred to for the material and the structure of the conductive layer 148.

Then, the conductive layer 148 is processed so that the gate electrode 148a is formed over the gate insulating layer 146 so as to overlap with the first oxide semiconductor layer 144a. At the same time, the first electrode 148b is formed over and in contact with the second oxide semiconductor layer 144b (see FIG. 6B).

Then, the insulating layer 150 is formed so as to cover the first electrode 148b, the second oxide semiconductor layer 144b, the gate insulating layer 146, and the gate electrode 148a. The description in Embodiment 1 can be referred to for the material and the structure of the gate insulating layer 150 (see FIG. 6C).

Figure 6C:
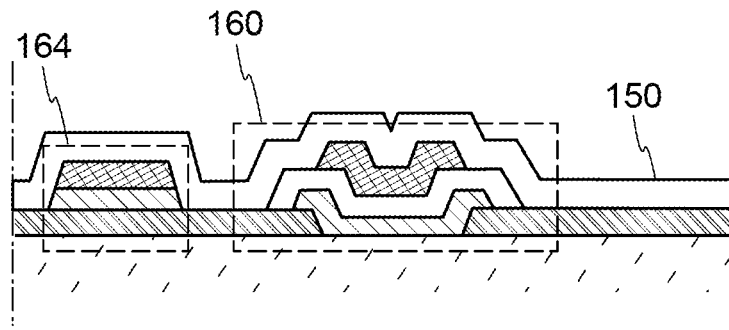

Through the above steps, the transistor 160 including an oxide semiconductor layer and the capacitor 164 are completed (see FIG. 6C).

Next, a manufacturing method of the transistor 160 in FIG. 4B will be described.

First, the conductive layer 142 is formed over the insulating layer 140 and the metal oxide layer is formed over the conductive layer 142. The description in Embodiment 1 can be referred to for the material and the structures of the conductive layer 142 and the metal oxide layer.

Then, the conductive layer 142 and the metal oxide layer are processed so that the source or drain electrode 142b, the metal oxide layer 149b, the drain or source electrode 142a, and the metal oxide layer 149a are formed.

Then, an oxide semiconductor layer is formed and is processed so that the first oxide semiconductor layer 144a electrically connected to the source or drain electrode 142b and the drain or source electrode 142a is formed. At the same time, the oxide semiconductor layer is processed so that the second oxide semiconductor layer 144b in contact with the metal oxide layer 149b is formed. The description in Embodiment 1 can be referred to for the material and the structure of the oxide semiconductor layer.

Next, an insulating layer is formed over the first oxide semiconductor layer 144a and is processed so that the gate insulating layer 146 is formed. The description in Embodiment 1 and of FIG. 4A can be referred to for the material and the structure of the gate insulating layer 146.

Next, the metal oxide layer is formed between the first oxide semiconductor layer 144a and the second oxide semiconductor layer 144b and the conductive layer 148 before the first oxide semiconductor layer 144a and the second oxide semiconductor layer 144b are in contact with the conductive layer 148. The description in Embodiment 1 can be referred to for the material and the structure of the metal oxide layer.

Next, the conductive layer 148 is formed. The description in Embodiment 1 can be referred to for the material and the structure of the conductive layer 148.

Then, the metal oxide layer and the conductive layer 148 are processed so that the metal oxide layer 141a and the gate electrode 148a are formed over the gate insulating layer 146 so as to overlap with the first oxide semiconductor layer 144a. At the same time, the metal oxide layer 141b and the first electrode 148b are formed over and in contact with the second oxide semiconductor layer 144b.

Then, the insulating layer 150 is formed so as to cover the first electrode 148b, the second oxide semiconductor layer 144b, the gate insulating layer 146, and the gate electrode 148a. The description in Embodiment 1 can be referred to for the material and the structure of the gate insulating layer 150.

Through the above steps, the transistor 160 including an oxide semiconductor layer and the capacitor 164 are completed.

<Cross-Sectional Structure of Semiconductor Device>

FIGS. 7A and 7B and FIGS. 8A to 8D are structural examples of a semiconductor device. FIGS. 7A and 7B and FIGS. 8A to 8C illustrate cross sections of the semiconductor device. The semiconductor devices shown in FIGS. 7A and 7B and FIGS. 8A to 8C each include the transistor 160 whose channel formation region includes an oxide semiconductor and the capacitor 164 whose dielectric includes an oxide semiconductor.

Figure 7A:
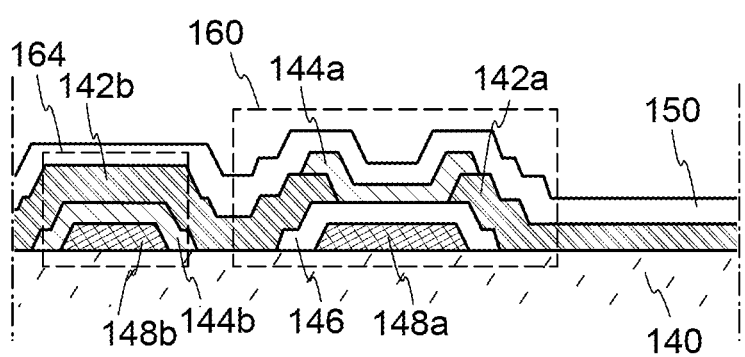
FIGS. 7A and 7B are cross-sectional views of a semiconductor device.

The transistor 160 in FIG. 7A includes the gate electrode 148a over the insulating layer 140; the gate insulating layer 146 covering the gate electrode 148a; the source or drain electrode 142b and the drain or source electrode 142a which are over the gate electrode layer 146; and the first oxide semiconductor layer 144a which is over and electrically connected to the source or drain electrode 142b and the drain or source electrode 142a and overlaps with the gate electrode 148a, over the gate insulating layer 146. Note that the transistor 160 may include, over the gate insulating layer 146, a metal oxide layer in contact with the source or drain electrode 142b and the drain or source electrode 142a.

The capacitor 164 in FIG. 7A includes the first electrode 148b, the second oxide semiconductor layer 144b in contact with the first electrode 148b, and the source or drain electrode 142b in contact with the second oxide semiconductor layer 144b. The source or drain electrode 142b here serves as a second electrode of the capacitor 164.

In other words, the capacitor 164 includes the first electrode 148b, the second oxide semiconductor layer 144b, and the second electrode, and the second electrode is formed using the same conductive layer as the source or drain electrode 142b.

Note that the capacitor 164 may include a metal oxide layer at a surface of the first electrode 148b, which is in contact with the second oxide semiconductor layer 144b. Alternatively, the capacitor 164 may include the metal oxide layer over the second oxide semiconductor layer 144b.

Further, the insulating layer 150 is provided over the transistor 160 and the capacitor 164.

Figure 7B:
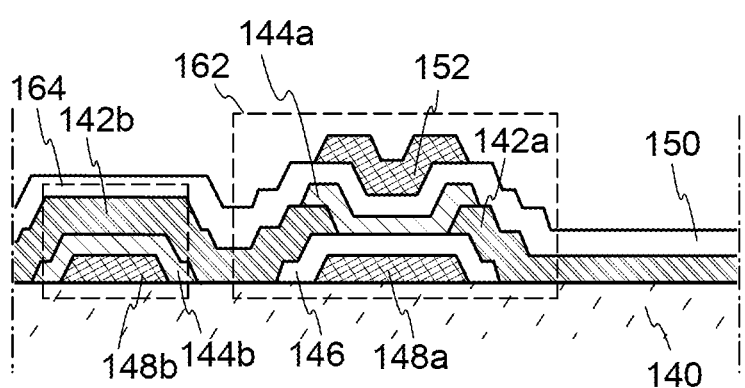

The transistor 162 and the capacitor 164 in FIG. 7B are modified examples of the transistor 160 and the capacitor 164 in FIG. 7A.

The structure in FIG. 7B is different from the structure in FIG. 7A in that the transistor 162 in FIG. 7B includes the electrode 152 over the insulating layer 150. The transistor 162 is a dual-gate transistor in which gate electrode layers are provided over and below the first oxide semiconductor layer 144a having a channel formation region, with insulating layers provided between the first oxide semiconductor layer 144a and the gate electrode layers. Specifically, the transistor 162 includes the gate electrode 148a; the gate insulating layer 146 over the gate electrode 148a; the source or drain electrode 142b and the drain or source electrode 142a which are over the gate insulating layer 146; the first oxide semiconductor layer 144a which is over and electrically connected to the source or drain electrode 142b and the drain or source electrode 142a; the insulating layer 150 over the source or drain electrode 142b, the drain or source electrode 142a, and the first oxide semiconductor layer 144a; and the electrode 152 overlapping with the first oxide semiconductor layer 144a, over the insulating layer 150.

The gate electrode 148a and the electrode 152 serve as gate electrodes in FIG. 7B. The potential of the electrode 152 may be the same as or different from that of the gate electrode 148a. The potential of the electrode 152 may be GND or 0V, or the electrode 152 may be in a floating state. By using the gate electrode 148a and the electrode 152, it is possible to control the electric field applied to the first oxide semiconductor layer 144a and thus the threshold voltage of the transistor 162.

Figure 8A:
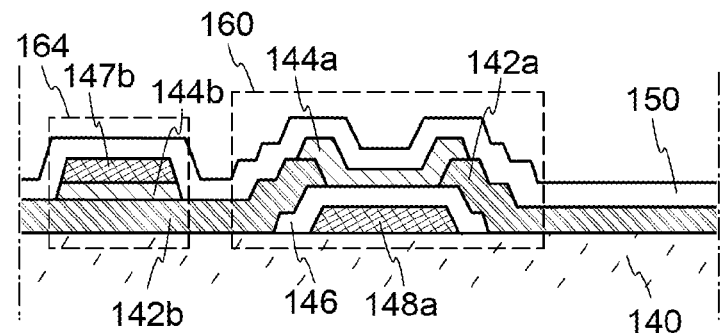
FIGS. 8A to 8D are cross-sectional views of semiconductor devices.

The transistor 160 and the capacitor 164 in FIG. 8A are modified examples of the transistor 160 and the capacitor 164 in FIG. 7A.

The structure of FIG. 8A is different from the structure of FIG. 7A in the method of manufacturing the capacitor electrode of the capacitor 164. The source or drain electrode 142b is formed over the first electrode 148b in FIG. 7A, whereas the electrode 147b is formed over the source or drain electrode 142b in FIG. 8A.

Figure 8B:
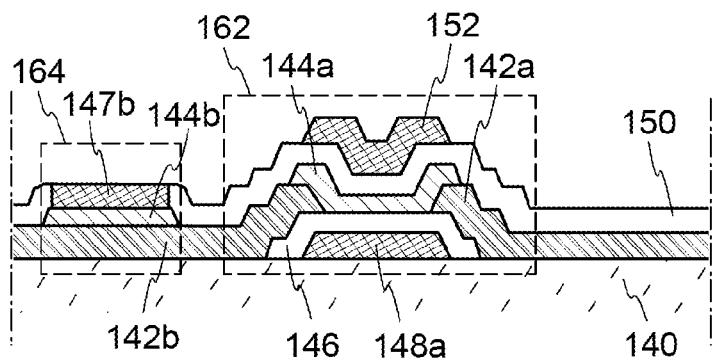

The transistor 160 and the capacitor 164 in FIG. 8B are modified examples of the transistor 162 and the capacitor 164 in FIG. 7B.

The structure of FIG. 8B is different from the structure of FIG. 7B in the method of manufacturing the capacitor electrode of the capacitor 164. The source or drain electrode 142b is formed over the first electrode 148b in FIG. 7B, whereas the first electrode 148b is formed over the source or drain electrode 142b in FIG. 8B.

Note that the transistor 162 may include, over the gate insulating layer 146, a metal oxide layer in contact with the source or drain electrode 142b, the drain or source electrode 142a, and the electrode 152.

Figure 8C:
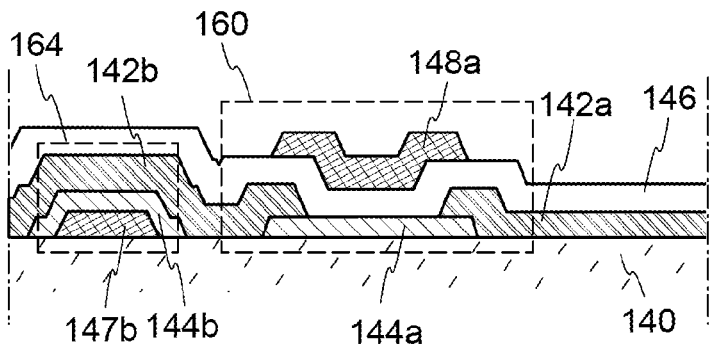

The transistor 160 in FIG. 8C includes the first oxide semiconductor layer 144a over the insulating layer 140; the source or drain electrode 142b and the drain or source electrode 142a which are over and electrically connected to the first oxide semiconductor layer 144a; the gate insulating layer 146 over the first oxide semiconductor layer 144a, the source or drain electrode 142b, and the drain or source electrode 142a; and the gate electrode 148a overlapping with the first oxide semiconductor layer 144a, over the gate insulating layer 146. Note that the transistor 160 may include, over the first oxide semiconductor layer 144a, the metal oxide layer 141b in contact with the source or drain electrode 142b and the metal oxide layer 141a in contact with the drain or source electrode 142a.

The capacitor 164 in FIG. 8C includes the electrode 147b, the second oxide semiconductor layer 144b, and the source or drain electrode 142b. Note that the capacitor 164 may include a metal oxide layer at a surface of the electrode 147b, which is in contact with the second oxide semiconductor layer 144b. Alternatively, the capacitor 164 may include the metal oxide layer over the second oxide semiconductor layer 144b.

Figure 8D:
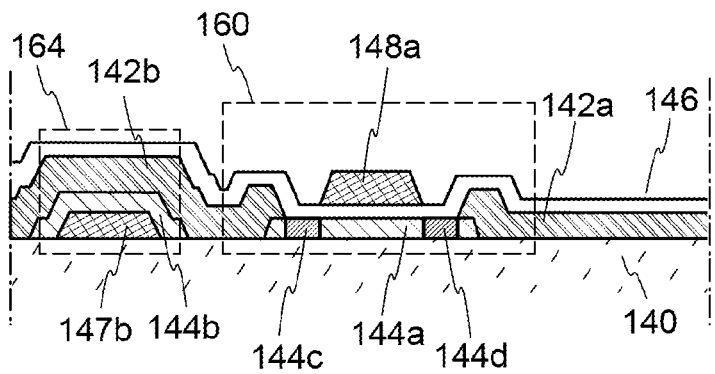

The transistor 160 and the capacitor 164 in FIG. 8D are modified examples of the transistor 160 and the capacitor 164 in FIG. 8C.

The structure in FIG. 8D is different from the structure in FIG. 8C in that the transistor 160 in FIG. 8D includes an impurity region 144c and an impurity region 144d in the first oxide semiconductor layer 144a The impurity region 144c and the impurity region 144d can be formed in a self-aligned manner by introducing an impurity through the gate insulating layer 146 with the use of the source or drain electrode 142b, the drain or source electrode 142a, and the gate electrode 148a as masks.

A Group 15 element such as nitrogen (N), phosphorus (P), arsenic (As), antimony (Sb), or the like can be used as the impurity. An example of introducing nitrogen will be described in this embodiment.

As a method of introducing an impurity, an ion implantation method, an ion doping method, or the like can be used. In an ion implantation method, a source gas is made into plasma, ion species included in this plasma are extracted and mass-separated, ion species with predetermined mass are accelerated, and an object is exposed to the accelerated ion species in the form of an ion beam so that the accelerated ion species are introduced into the object. In an ion doping method, a source gas is made into plasma, ion species are extracted from this plasma by an operation of a predetermined electric field, the extracted ion species are accelerated without mass separation, and an object is exposed to the accelerated ion species in the form of an ion beam. Nitrogen is introduced by an ion implantation method in which mass-separation is performed, so that an element other than the desired impurity (here, nitrogen), for example, a metal element or the like can be prevented from being added to the first oxide semiconductor layer 144a. On the other hand, an ion doping method enables ion-beam exposure to a larger area than an ion implantation method, and therefore, when the addition of oxygen is performed using an ion doping method, the takt time can be shortened.

The nitrogen concentrations in the impurity region 144c and the impurity region 144d are preferably higher than or equal to $5\times10^{19}$ atoms/cm$^3$. Note that the nitrogen concentrations in the impurity region 144c and the impurity region 144d are measured by SIMS (secondary ion mass spectroscopy).

When the nitrogen concentrations in the impurity region 144c and the impurity region 144d are higher than or equal to $1\times10^{20}$ atoms/cm$^3$ and lower than 7 atomic %, the crystal structure may become a wurtzite type by performing heat treatment after the impurity region 144c and the impurity region 144d are formed. The temperature of the heat treatment is in the range of 300° C. to 600° C., preferably 350° C. to 500° C.

Further, an impurity is introduced through the gate insulating layer 146 as described in this embodiment and thus excess damage to the first oxide semiconductor layer 144a can be reduced.

Note that the method whereby an impurity is introduced through the gate insulating layer 146 is described as an example in this embodiment; however, the method is not limited thereto and for example, an impurity may be introduced through an insulating layer formed later.

As described above, the impurity regions are formed in the first oxide semiconductor layer 144a so that the channel formation region is sandwiched between the impurity regions; accordingly, carriers flow easily through the impurity regions because the impurity regions have smaller energy gap than the channel formation region. For this reason, data can be written at high speed with such a structure of a transistor.

Further, the structure in which the channel formation region is sandwiched between the impurity regions relieves the concentration of an electric field at both ends of the drain electrode.

The impurity region 144c and the impurity region 144d can be referred to as low-resistance regions (or n-type regions) because resistance of the first oxide semiconductor layer 144a is lowered by impurity introduction.

The method whereby the low-resistance regions (the impurity region 144c and the impurity region 144d) are formed in the oxide semiconductor is shown in FIG. 8D. As an example of a method of forming an impurity region serving as a source region or a drain region in a transistor including an oxide semiconductor by a self-aligned process, a method in which the surface of an oxide semiconductor layer is exposed and argon plasma treatment is performed so that the resistance of regions in the oxide semiconductor layer exposed to plasma is lowered is disclosed (S. Jeon et al. "180 nm Gate Length Amorphous InGaZnO Thin Film Transistor for High Density Image Sensor Application", IEDM Tech. Dig., 2010, pp. 504).

In the manufacturing method, after a gate insulating layer is formed, the gate insulating layer needs to be partly removed so that portions to be a source region and a drain region are exposed. Thus, a lower oxide semiconductor layer is partly over-etched while the gate insulating layer is removed, so that the thickness of the portions to be a source region and a drain region are reduced. Consequently, the resistance of the source region and the drain region is increased and defects of transistor characteristics due to the over-etching easily occur.

A dry etching method by which processing is performed with high precision needs to be used in order to miniaturize a transistor. However, the over-etching occurs remarkably in the case where a dry etching method in which the etching selectivity of a gate insulating layer to an oxide semiconductor layer is not sufficiently high.

For example, over-etching does not cause any problem when the oxide semiconductor layer has enough thickness; however, in the case where the channel length is shorter than or equal to 200 nm, the portion to be a channel formation region in the oxide semiconductor layer needs to have a thickness of 20 nm or less, preferably 10 nm or less in order to avoid a short channel effect. When an oxide semiconductor layer has such a small thickness, over-etching of the oxide semiconductor layer is unfavorable because the resistance of a source region and a drain region is increased and defects of transistor characteristics are caused as described above.

However, an impurity is introduced to the oxide semiconductor layer without exposing the oxide semiconductor layer and removing the gate insulating layer as described in this embodiment, so that over-etching of the oxide semiconductor layer can be suppressed and excess damage to the oxide semiconductor layer can be reduced. Accordingly, characteristics and reliability of the transistor can be improved.

Note that the structure described in this embodiment can be used in appropriate combination with any of structures described in the other embodiments.

Embodiment 3

Figure 9A:
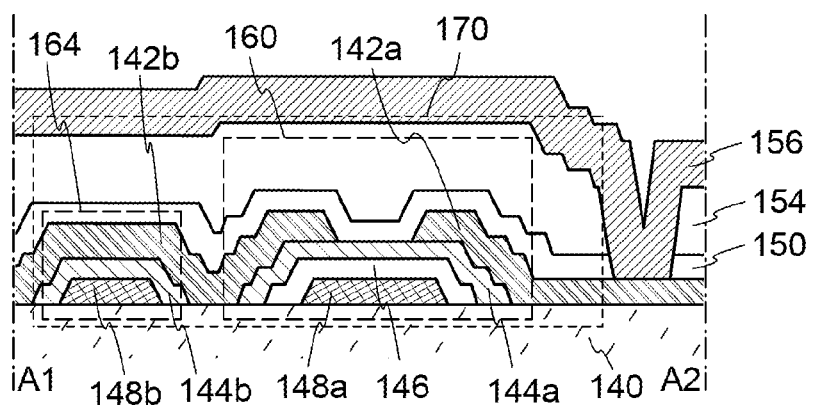
FIGS. 9A, 9B, and 9C are a cross-sectional view, a top view, and a circuit diagram of a semiconductor device, respectively.
Figure 9B:
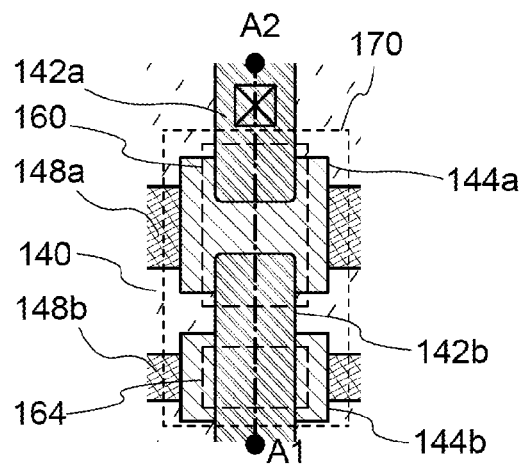
Figure 9C:
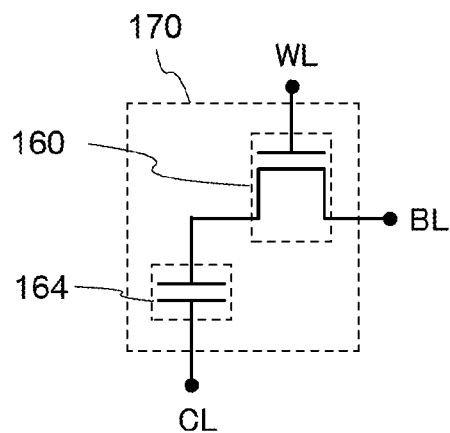

In this embodiment, an example of a memory cell 170 including the semiconductor devices in Embodiment 1 and Embodiment 2 will be shown with reference to FIGS. 9A to 9C.

<Structure of Memory Cell>

FIG. 9A is a cross-sectional view of the memory cell 170. FIG. 9B is a top-view of the memory cell 170. FIG. 9C is a circuit diagram of the memory cell 170.

FIGS. 9A and 9B corresponds to the semiconductor device of FIG. 1A; however, this embodiment is not limited thereto. Any of the semiconductor devices of FIGS. 1A to 1D, FIGS. 3A to 3C, and FIGS. 4A and 4B can be used, and alternatively, another semiconductor device with a function similar to the structure of the semiconductor devices can be used.

The memory cell 170 of FIGS. 9A to 9C includes the transistor 160 and the capacitor 164.

In the memory cell 170 of FIG. 9A, the drain or source electrode 142a of the transistor 160 is electrically connected to a wiring 156 through an opening in the insulating layer 150 and an insulating layer 154. Note that FIG. 9A shows a structure in which the insulating layer 150 and the insulating layer 154 are stacked; however, the structure is not limited thereto. Three or more insulating layers may be stacked, and alternatively, only one insulating layer may be provided.

In the memory cell 170 of FIG. 9C, a first wiring (also referred to as a bit line BL) is electrically connected to one of a source electrode and a drain electrode of the transistor 160, and a second wiring (also referred to as a word line WL) is electrically connected to a gate electrode of the transistor 160. Further, the other of the source electrode and the drain electrode of the transistor 160 is electrically connected to one electrode of the capacitor 164. A third wiring (also referred to as a capacitor line CL) is electrically connected to the other electrode of the capacitor 164.

Here, a transistor including an oxide semiconductor described in Embodiments 1 and 2 is used for the transistor 160. The transistor including an oxide semiconductor described in Embodiments 1 and 2 has a characteristic of extremely low off-state current. Therefore, the potential supplied to the capacitor 164 can be held for an extremely long time by turning off the transistor 160. Note that the transistor 160 including an oxide semiconductor has a channel length (L) greater than or equal to 10 nm and less than or equal to 1000 nm and thus consumes a small amount of power and operates at extremely high speed.

The capacitor in which an oxide semiconductor is used for a dielectric described in Embodiments 1 and 2 is used as the capacitor 164. An oxide semiconductor has high dielectric constant and thus capacitance of the capacitor 164 per unit area can be increased when an oxide semiconductor is used for a dielectric of the capacitor 164.

The semiconductor device illustrated in FIG. 9C utilizes a characteristic in which the potential supplied to the capacitor 164 can be held, whereby writing, storing, and reading of data can be performed as follows.

Firstly, writing and holding of data will be described. For simplicity, the potential of the third wiring is fixed here. First, the potential of the second wiring is set to a potential which allows the transistor 160 to be turned on, so that the transistor 160 is turned on. In this manner, the potential of the first wiring is supplied to the one electrode of the capacitor 164. That is, predetermined charge is given to the capacitor 164 (writing). After that, the potential of the second wiring is set to a potential which allows the transistor 160 to be turned off, so that the transistor 160 is turned off. Thus, the charge given to the capacitor 164 is held (storing). The transistor 160 has extremely low off-state current as described above and thus can hold the charge for a long time.

Secondly, reading of data will be described. By setting the potential of the second wiring to a potential which allows the transistor 160 to be turned on while predetermined potential (constant potential) is supplied to the wiring line, the potential of the first wiring varies depending on the amount of charge held in the capacitor 164. Therefore, the stored data can be read by the potential of the first wiring.

Since the charge of the capacitor 164 is lost in the case where the data is read, it is to be noted that another writing is performed.

Thirdly, rewriting of data will be described. Rewriting of data is performed in a manner similar to that of the writing and holding of data. That is, the potential of the second wiring is set to a potential which allows the transistor 160 to be turned on, so that the transistor 160 is turned on. Accordingly, the potential of the first wiring (potential related to new data) is supplied to the one electrode of the capacitor 164. After that, the potential of the second wiring is set to a potential which allows the transistor 160 to be turned off, so that the transistor 160 is turned off. Thus, charge related to new data is given to the capacitor 164.

In the semiconductor device according to the invention disclosed herein, data can be directly rewritten by another writing of data as described above. Therefore, high-speed operation of the semiconductor device can be realized.

Note that an n-channel transistor (an n-type transistor) in which electrons are carriers is used in the above description, but it will be appreciated that a p-channel transistor in which holes are majority carriers can be used instead of the n-channel transistor.

Embodiment 4

In this embodiment, a structure of a semiconductor device including the semiconductor devices in Embodiments 1 to 3 will be described with reference to FIGS. 10A and 10B, FIG. 11, and FIG. 12.

<Structure of Semiconductor Device>

Figure 10A:
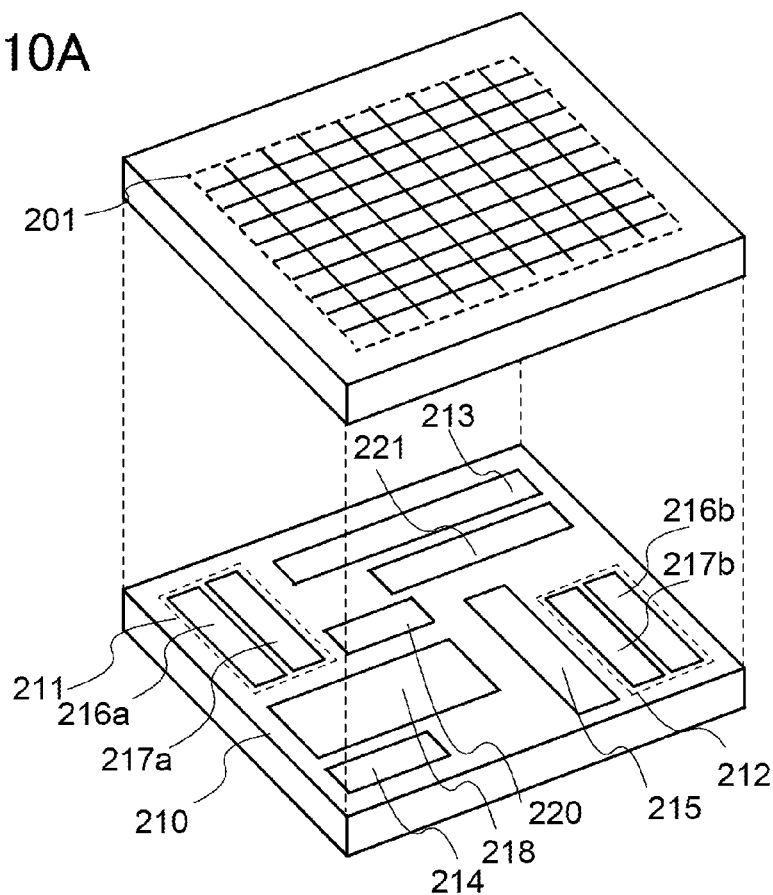
FIGS. 10A and 10B are a schematic diagram and a cross-sectional view of a semiconductor device, respectively.

FIG. 10A is an example showing a schematic view of a structure of a semiconductor device. The semiconductor device according to one embodiment of the present invention has a stacked-layer structure. The semiconductor device according to one embodiment of the present invention includes a memory circuit in an upper portion, and a peripheral circuit including a driver circuit, a control circuit, and the like, which needs to operate at high speed for driving the memory circuit, in a lower portion. Note that the driver circuit or the control circuit may be a logic circuit and may include an analog circuit or an arithmetic circuit.

The semiconductor device illustrated in FIG. 10A includes a memory cell array 201 including a plurality of memory cells as a memory circuit in an upper portion and a peripheral circuit 210 including a first driver circuit 211, a second driver circuit 212, a third driver circuit 213, a fourth driver circuit 214, a fifth driver circuit 215, a controller 218, an address buffer 221, an I/O buffer 220, and the like, which is necessary for operating the memory cell array 201, in a lower portion. The first driver circuit 211 includes a column decoder 217a and a sense amplifier group 216a, and the second driver circuit 212 includes a column decoder 217b and a sense amplifier group 216b.

As a substrate where the peripheral circuit 210 illustrated in FIG. 10A is provided, a semiconductor substrate including a Group 14 element, such as silicon, germanium, silicon germanium, or silicon carbide, a compound semiconductor substrate, such as gallium arsenide or indium phosphide, an SOI substrate, or the like can be used, for example. Note that the term "SOI substrate" generally means a substrate where a silicon layer is provided over an insulating surface. In this specification and the like, the term "SOI substrate" also means a substrate where a semiconductor layer containing a material other than silicon is provided over an insulating surface. Moreover, the SOI substrate can be a substrate having a structure in which a semiconductor layer is provided over an insulating substrate such as a glass substrate, with an insulating layer provided therebetween. It is preferable to form the peripheral circuit 210 using any of the above-described substrates because the peripheral circuit 210 can be made to operate at high speed.

<Cross-Sectional Structure of Semiconductor Device>

Figure 10B:
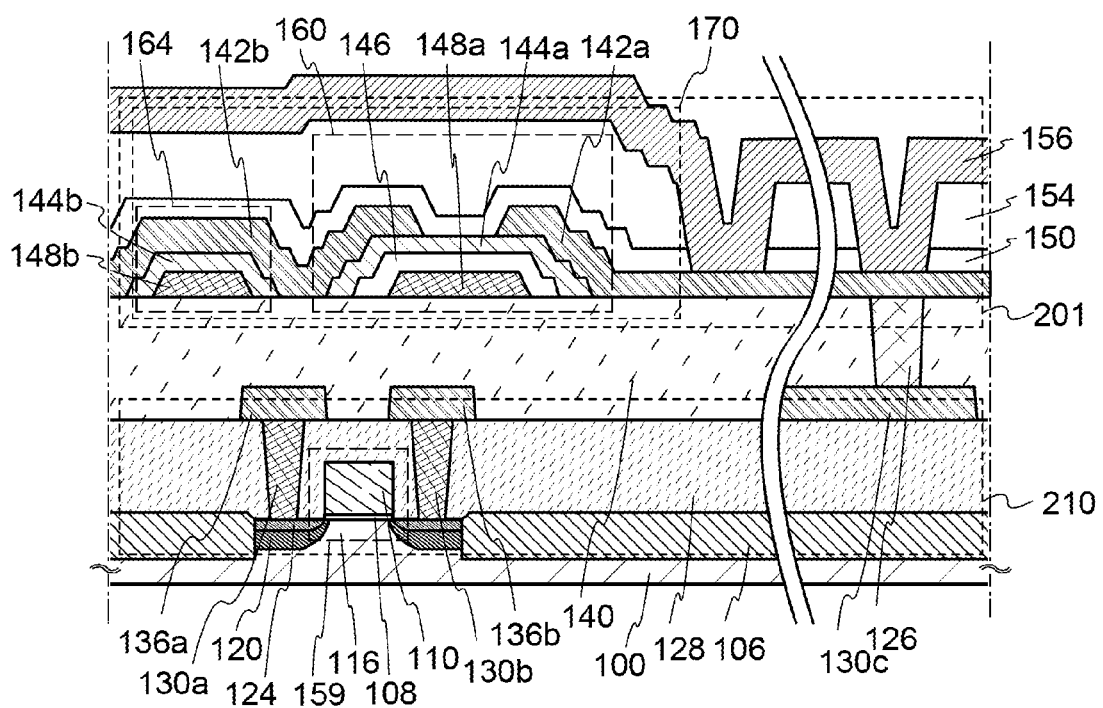

FIG. 10B is a cross-sectional view of the semiconductor device. The semiconductor device illustrated in FIGS. 10A and 10B includes the memory cell array 201 in an upper portion and the peripheral circuit 210 in a lower portion. The memory cell array 201 in the upper portion includes a transistor 160 including an oxide semiconductor, and the peripheral circuit 210 in the lower portion includes a transistor 159 including a semiconductor material other than an oxide semiconductor. Note that the description in Embodiments 1 to 3 can be referred to for the description of the memory cell 170 in an upper portion of the semiconductor device.

Either an n-channel transistor or a p-channel transistor can be employed as the transistor 159 and the transistor 160. Here, both the transistor 159 and the transistor 160 are n-channel transistors in the following description. Since the technical feature of one embodiment of the present invention is to use a semiconductor material such as an oxide semiconductor, which can sufficiently reduce off-state current, for the transistor 160 and the capacitor 164 in order to hold data, it is not necessary to specifically limit a structure or a material of the semiconductor device to those given here.

The transistor 159 includes a channel formation region 116 provided in a substrate 100 including a semiconductor material (e.g., silicon), impurity regions 120 provided such that the channel formation region 116 is sandwiched therebetween, metal compound regions 124 in contact with the impurity regions 120, a gate insulating layer 108 provided over the channel formation region 116, a gate electrode 110 provided over the gate insulating layer 108, and a source or drain electrode 130b and a drain or source electrode 130a electrically connected to the metal compound regions 124. In addition, an insulating layer 128 is provided so as to cover the transistor 160. The source or drain electrode 130b and the drain or source electrode 130a are each electrically connected to the metal compound regions 124 through an opening in the insulating layer 128. Over the insulating layer 128, an electrode 136a is formed in contact with the source or drain electrode 130b and an electrode 136b is formed in contact with the drain or source electrode 130a.

The substrate 100 is provided with the element isolation insulating layer 106 which surrounds the transistor 159. Note that in order to realize higher integration, the transistor 159 preferably has a structure without a sidewall insulating layer as illustrated in FIG. 10B. On the other hand, in the case where importance is put on characteristics of the transistor 159, a sidewall insulating layer may be provided on the side surface of the gate electrode 110, and the impurity regions 120 may include a region having a different impurity concentration in a region overlapping with the sidewall insulating layer.

The description of the transistor 160 and the transistor 162 in Embodiments 1 to 3 can be referred to for the description of the transistor 160 in FIG. 10B.

The description of the capacitor 164 in Embodiments 1 to 3 can be referred to for the description of the capacitor 164.

The insulating layer 150 and the insulating layer 154 are provided over the transistor 160 and the capacitor 164. The drain or source electrode 142a of the transistor 160 is electrically connected to a wiring 156 through openings in the insulating layer 150, the insulating layer 154, and the like. The wiring 156 electrically connects one memory cell to another memory cell. The wiring 156 is further electrically connected to a wiring 130c through the drain or source electrode 142a and the electrode 126. Accordingly, the peripheral circuit 210 in the lower portion can be electrically connected to the memory cell array 201 in the upper portion.

In the semiconductor device illustrated in FIG. 10B, an insulating layer 140 is provided between the memory cell array 201 in the upper portion and the peripheral circuit 210 in the lower portion.

The transistor 159 includes a semiconductor material other than an oxide semiconductor. The semiconductor material other than an oxide semiconductor can be, for example, silicon, germanium, silicon germanium, silicon carbide, indium phosphide, gallium arsenide, or the like and is preferably single crystal. Alternatively, an organic semiconductor material or the like may be used. A transistor including such a semiconductor material can operate at sufficiently high speed. Therefore, a transistor including a material other than an oxide semiconductor can favorably realize a variety of circuits (e.g., a logic circuit or a driver circuit) which needs to operate at high speed.

On the other hand, the transistor 160 includes an oxide semiconductor material. A transistor including an oxide semiconductor material disclosed in this specification and the like can realize an extremely small off-state current. Owing to this feature, the memory cell 170 can hold stored data for an extremely long time. In other words, power consumption can be reduced because refresh operation becomes unnecessary or the frequency of refresh operation can be extremely low. Moreover, stored data can be held for a long period even when power is not supplied (note that a potential is preferably fixed).

A capacitor in which the oxide semiconductor is used for a dielectric is used as the capacitor 164. An oxide semiconductor has high dielectric constant and thus capacitance of the capacitor 164 per unit area can be increased when an oxide semiconductor is used for a dielectric of the capacitor 164.

A semiconductor device having a novel feature can be formed by being provided with both a peripheral circuit such as a driver circuit including a transistor containing a material other than an oxide semiconductor (a transistor capable of operating at sufficiently higher speed than a transistor including an oxide semiconductor) and a memory circuit including a transistor including an oxide semiconductor (in a broader sense, a transistor whose off-state current is sufficiently small) and a capacitor including an oxide semiconductor.

Figure 11:
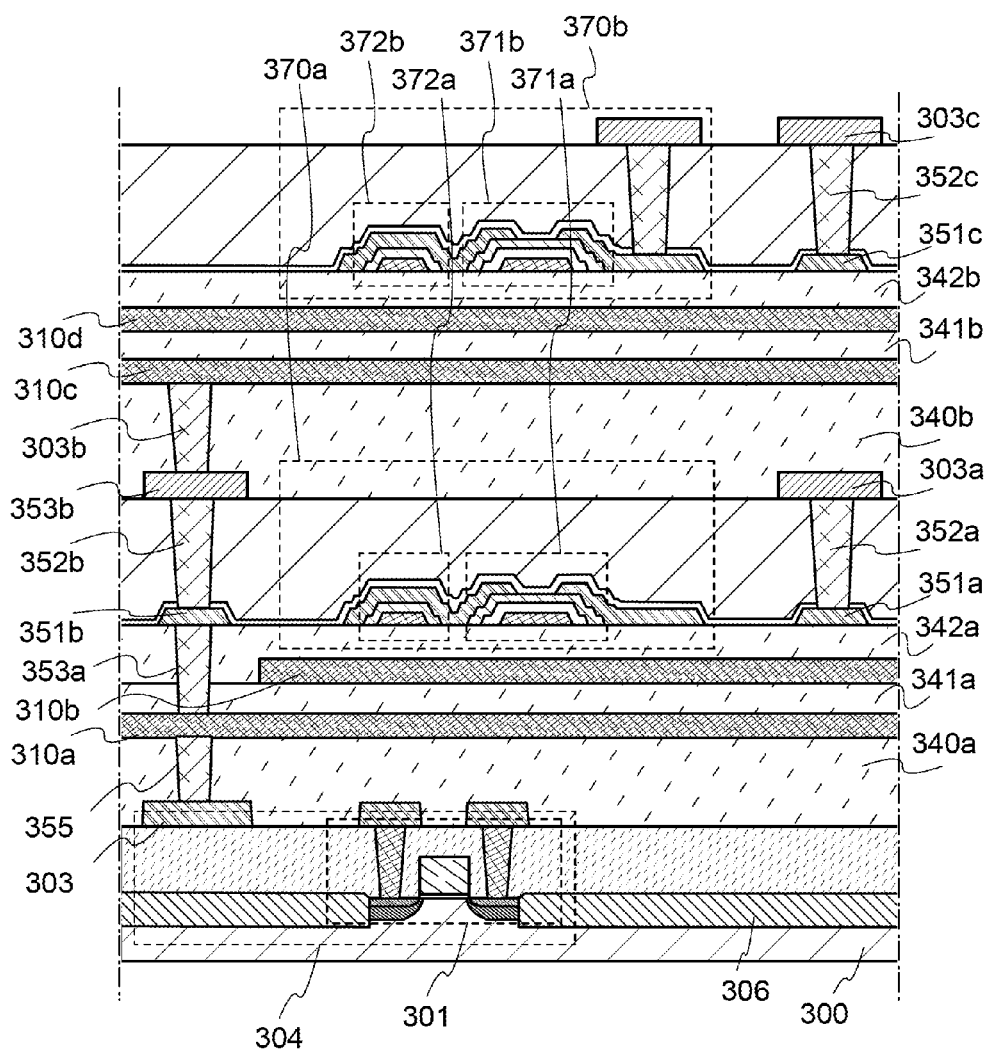
FIG. 11 is a cross-sectional view of a semiconductor device.
Figure 12:
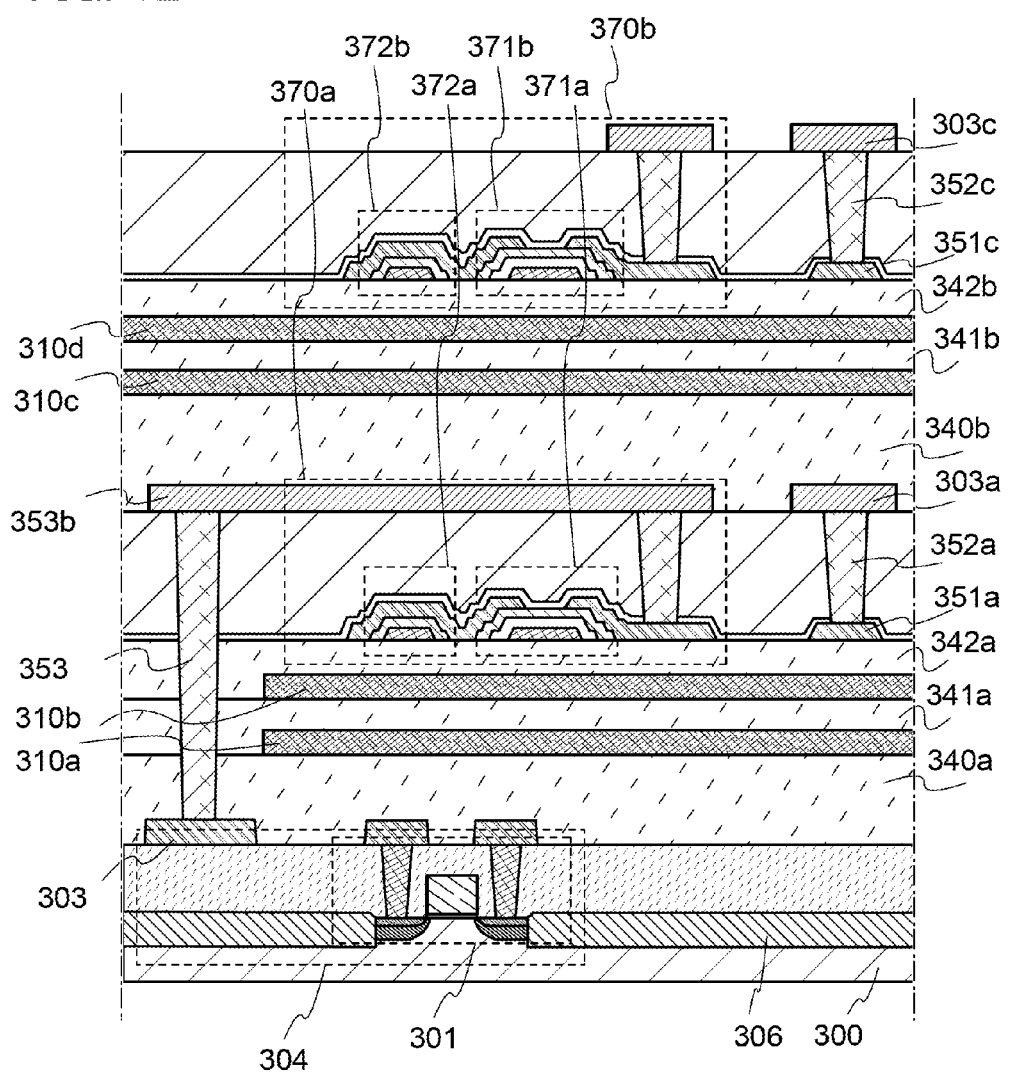
FIG. 12 is a cross-sectional view of a semiconductor device.

Note that although, in FIGS. 10A and 10B, an example in which one layer of the memory cell array 201 is stacked over the periphery circuit 210 is shown, one embodiment of the present invention is not limited thereto, and two or more layers of the cell array may be stacked as shown in FIG. 11 and FIG. 12.

FIG. 11 and FIG. 12 are cross-sectional views of a memory device. The memory device in FIG. 11 and FIG. 12 each includes a plurality of memory cells in which many layers are stacked, in an upper portion, and a periphery circuit 304 in a lower portion. A memory cell 370a and a memory cell 370b are shown as representative among the plurality of the memory cells.

Note that a transistor 371a and a capacitor 372a included in the memory cell 370a are shown as representatives. A transistor 371b and a capacitor 372b included in the memory cell 370b are shown as representatives. In each of the transistor 371a and the transistor 371b, a channel is formed in an oxide semiconductor layer. The structure of the transistor in which a channel is formed in an oxide semiconductor layer is similar to the structure described in the above embodiments and thus the description is omitted. The capacitor 372a and the capacitor 372b include an oxide semiconductor as a dielectric. The structure of the capacitor in which an oxide semiconductor is used as a dielectric is similar to the structure described in the above embodiments and thus the description is omitted.

An electrode 351a formed of the same layer as a source electrode and a drain electrode of the transistor 371a is electrically connected to an electrode 303a through an electrode 352a. An electrode 351c formed of the same layer as a source electrode and a drain electrode of the transistor 371b is electrically connected to an electrode 303c through an electrode 352c.

The periphery circuit 304 includes a transistor 301 in which a semiconductor material other than an oxide semiconductor is used for a channel formation region. The transistor 301 has a structure in which element separation insulating layers 306 are formed over a substrate 300 containing a semiconductor material (such as silicon) and a channel region is formed in a region sandwiched between the element separation insulating layers 306. Note that the transistor 301 may have a structure in which a channel is formed in a semiconductor layer, such as a silicon layer over an insulating surface, or in a silicon layer of an SOI substrate. A known structure can be used as the structure of the transistor 301 and thus the description is omitted.

A wiring 310a and a wiring 310b are formed between a layer in which the transistor 371a is formed and a layer in which the transistor 301 is formed. An insulating layer 340a is formed between the wiring 310a and the layer in which the transistor 301 is formed. An insulating layer 341a is formed between the wiring 310a and the wiring 310b. An insulating layer 342a is formed between the wiring 310b and the layer in which the transistor 371a is formed.

Similarly, a wiring 310c and a wiring 310d are formed between the layer in which transistor 371a is formed and the layer in which the transistor 371b is formed. An insulating layer 340b is formed between the wiring 310c and the layer in which the transistor 371a is formed. An insulating layer 341b is formed between the wiring 310c and the wiring 310d. An insulating layer 342b is formed between the wiring 310d and the layer in which the transistor 371b is formed.

The insulating layer 340a, the insulating layer 341a, the insulating layer 342a, the insulating layer 340b, the insulating layer 341b, and the insulating layer 342b serve as interlayer insulating layers, and surfaces of them may be planarized.

The wiring 310a, the wiring 310b, the wiring 310c, and the wiring 310d enable electrical connection between the memory cells, between the periphery circuit 304 and the memory cell, and the like.

The electrode 303 included in the periphery circuit 304 can be electrically connected to a circuit in an upper portion.

For example, the electrode 303 can be electrically connected to the wiring 310a through the electrode 355 as shown in FIG. 11. The wiring 310a can be electrically connected to the electrode 351b through the electrode 353a. The electrode 351b is formed of the same layer as the layer in which the transistor 371a is formed and can be electrically connected to the transistor 371a or the capacitor 372a (not shown). The electrode 351b can be electrically connected to the wiring 353b through the electrode 352b. The wiring 353b can be electrically connected to the wiring 310c through the electrode 303b.

An example in which the electrode 303 is electrically connected to the transistor 371a through the wiring 310a is shown in FIG. 11; however, there is no limitation thereto. The electrode 303 may be electrically connected to the transistor 371a through the wiring 310b, and alternatively, through both the wiring 310a and the wiring 310b. In addition, the electrode 303 may be electrically connected to the transistor 371a without using the wiring 310a and the wiring 310b as shown in FIG. 12. The electrode 303 is electrically connected to the wiring 353b through the electrode 353 in FIG. 12. The wiring 353b is electrically connected to the source or the drain of the transistor 371a. Through the above, the electrode 303 can be electrically connected to the transistor 371a.

Note that an example in which the two memory cells (the memory cell 370a and the memory cell 370b) are stacked is shown in FIG. 11 and FIG. 12; however, the number of stacked layers is not limited thereto.

In addition, the structure is shown in FIG. 11 and FIG. 12 in which the two wiring layers of the wiring layer in which the wiring 310a is formed and the wiring layer in which the wiring 310b is formed are formed between the layer in which the transistor 371a is formed and the layer in which the transistor 301 is formed; however, the structure is not limited thereto. One wiring layer or three or more wiring layers may be formed between the layer in which the transistor 371a is formed and the layer in which the transistor 301 is formed.

Further, the structure is shown in FIG. 11 and FIG. 12 in which the two wiring layers of the wiring layer in which the wiring 310c is formed and the wiring layer in which the wiring 310d is formed are formed between the layer in which the transistor 371b is formed and the layer in which the transistor 371a is formed; however, the structure is not limited thereto. One wiring layer or three or more wiring layers may be formed between the layer in which the transistor 371b is formed and the layer in which the transistor 371a is formed.

Embodiment 5

In this embodiment, an example in which the semiconductor device described in the above embodiments is utilized for portable electronic devices such as a mobile phone, a smart phone, an e-book reader, or the like, will be described with reference to FIGS. 13A and 13B, FIG. 14, FIG. 15, and FIG. 16.

In portable electronic devices such as a mobile phone, a smart phone, and an e-book reader, an SRAM or a DRAM is used so as to store image data temporarily. This is because response speed of a flash memory is low and thus a flash memory is not suitable for image processing. However, an SRAM and a DRAM have the following feature when an SRAM or a DRAM is used for storing image data temporarily.

Figure 13A:
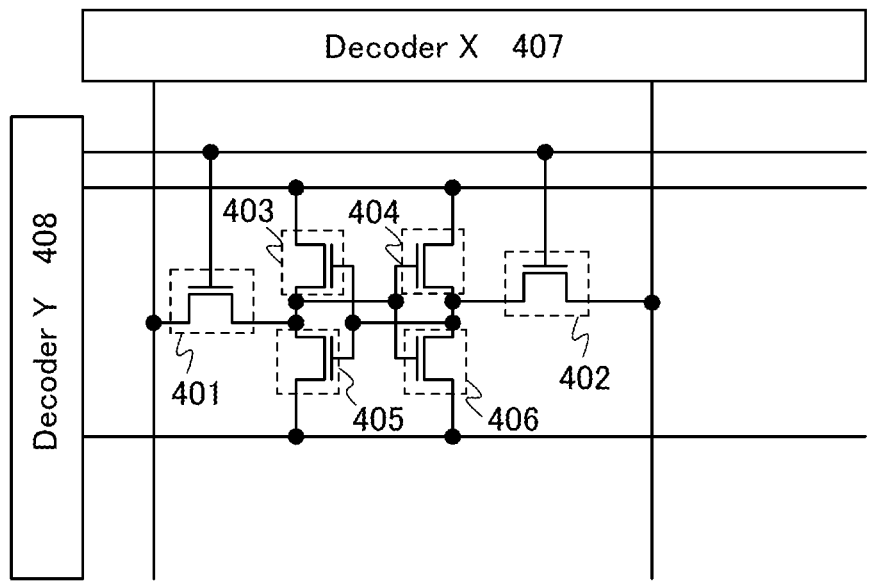
FIGS. 13A and 13B are circuit diagrams of semiconductor devices.

A general SRAM has such a structure shown in FIG. 13A that one memory cell includes six transistors 401 to 406 and each of the transistors are driven by an X decoder 407 and a Y decoder. The transistors 403 and 405 and the transistors 404 and 406 each comprises an inverter and can be driven at high speed. However, an SRAM has a disadvantage of large cell area because one memory cell includes six transistors. Provided that the minimum feature size of a design rule is F, the area of a memory cell in an SRAM is generally from 100 $F^2$ to 150 $F^2$. Therefore, it is a problem that a price per bit of an SRAM is the most expensive among semiconductor memory devices.

Figure 13B:
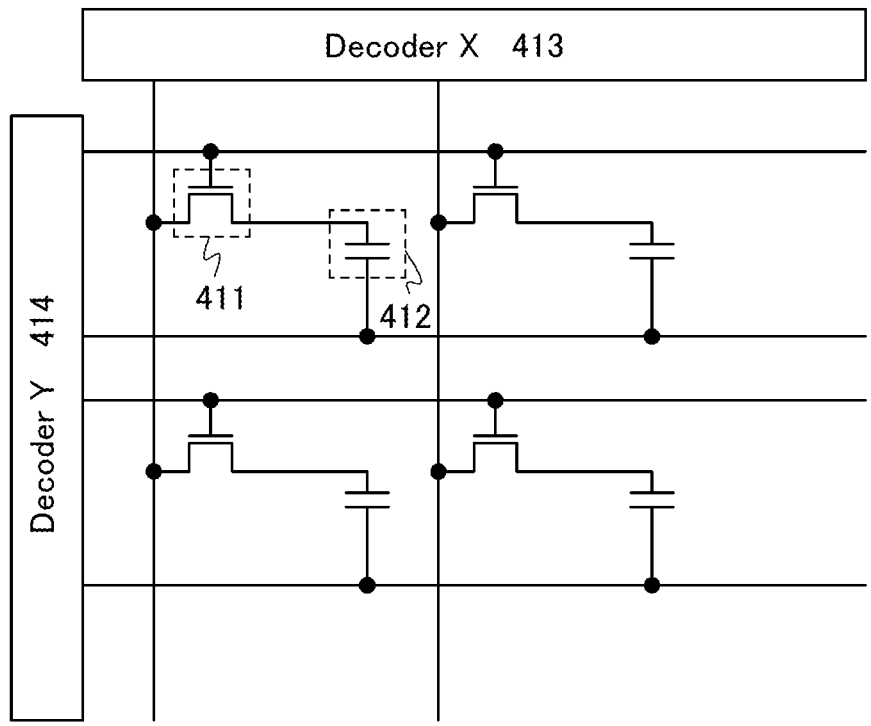

On the other hand, as shown in FIG. 13B, a DRAM has a memory cell including a transistor 411 and a capacitor 412 and being driven by an X decoder 413 and a Y decoder 414. One cell includes one transistor and one capacitor and thus the area of a memory cell is small. The area of a memory cell in a DRAM is generally less than or equal to 10 $F^2$. However, in the case of a DRAM, a refresh operation is necessary and power is consumed even when a rewriting operation is not performed, which is a problem.

However, the area of the memory cell of the semiconductor device described the above embodiments is about 10 $F^2$ and frequent refreshing is not needed. Consequently, a memory cell with small area and low power consumption can be provided.

Figure 14:
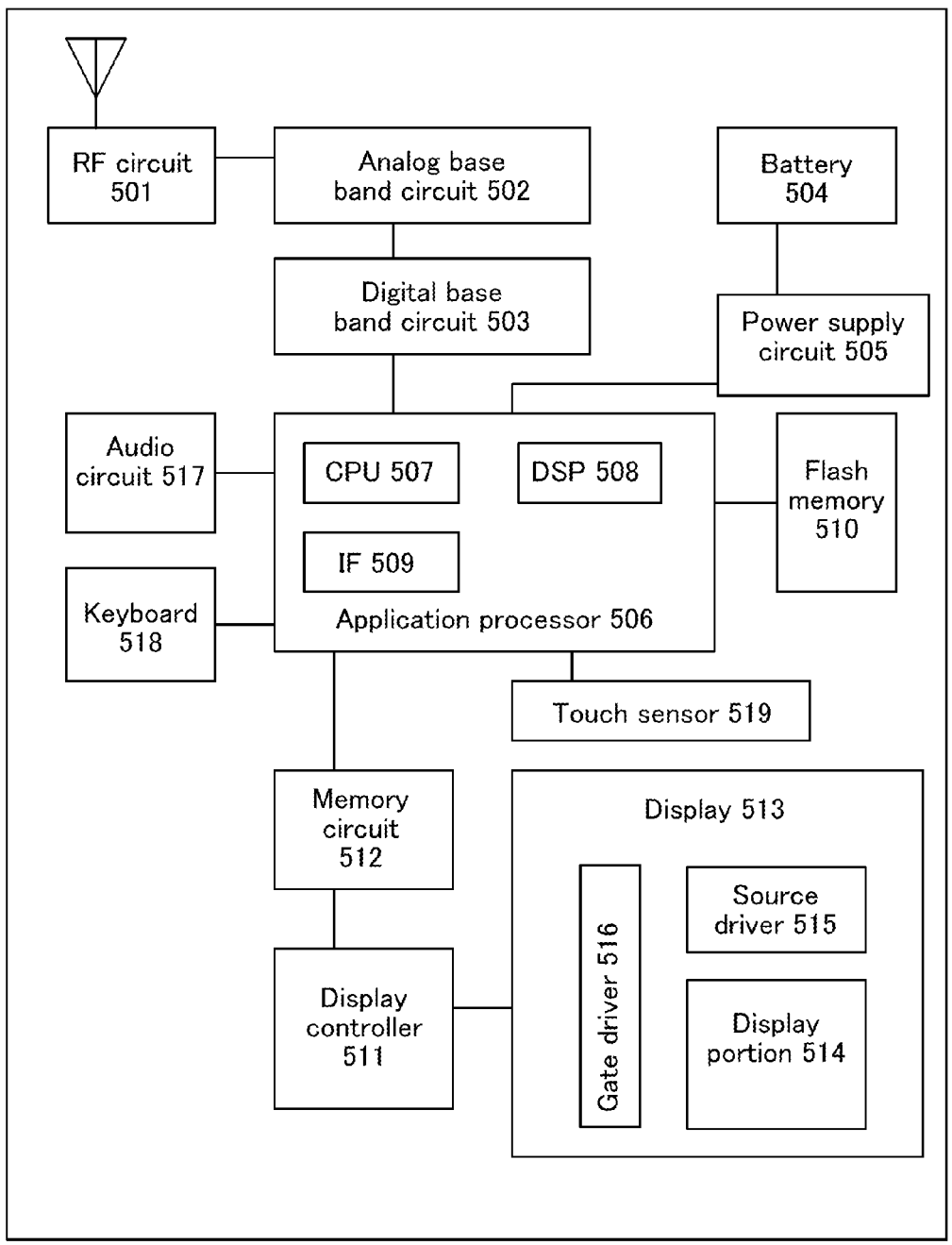
FIG. 14 is a block diagram of a semiconductor device.

Next, FIG. 14 is a block diagram of a portable device. The portable device in FIG. 14 includes an RF circuit 501, an analog base band circuit 502, a digital base band circuit 503, a battery 504, a power supply circuit 505, an application processor 506, a flash memory 510, a display controller 511, a memory circuit 512, a display 513, a touch sensor 519, an audio circuit 517, a keyboard 518, and the like. The display 513 includes a display portion 514, a source driver 515, and a gate driver 516. The application processor 506 includes a CPU 507, a DSP 508, and an interface 509 (an IF 509). A memory circuit generally includes an SRAM or a DRAM, and the semiconductor device described in the above embodiments is used for the memory circuit 512, so that a portable device in which data is written and read at high speed and power consumption is reduced can be provided.

Figure 15:
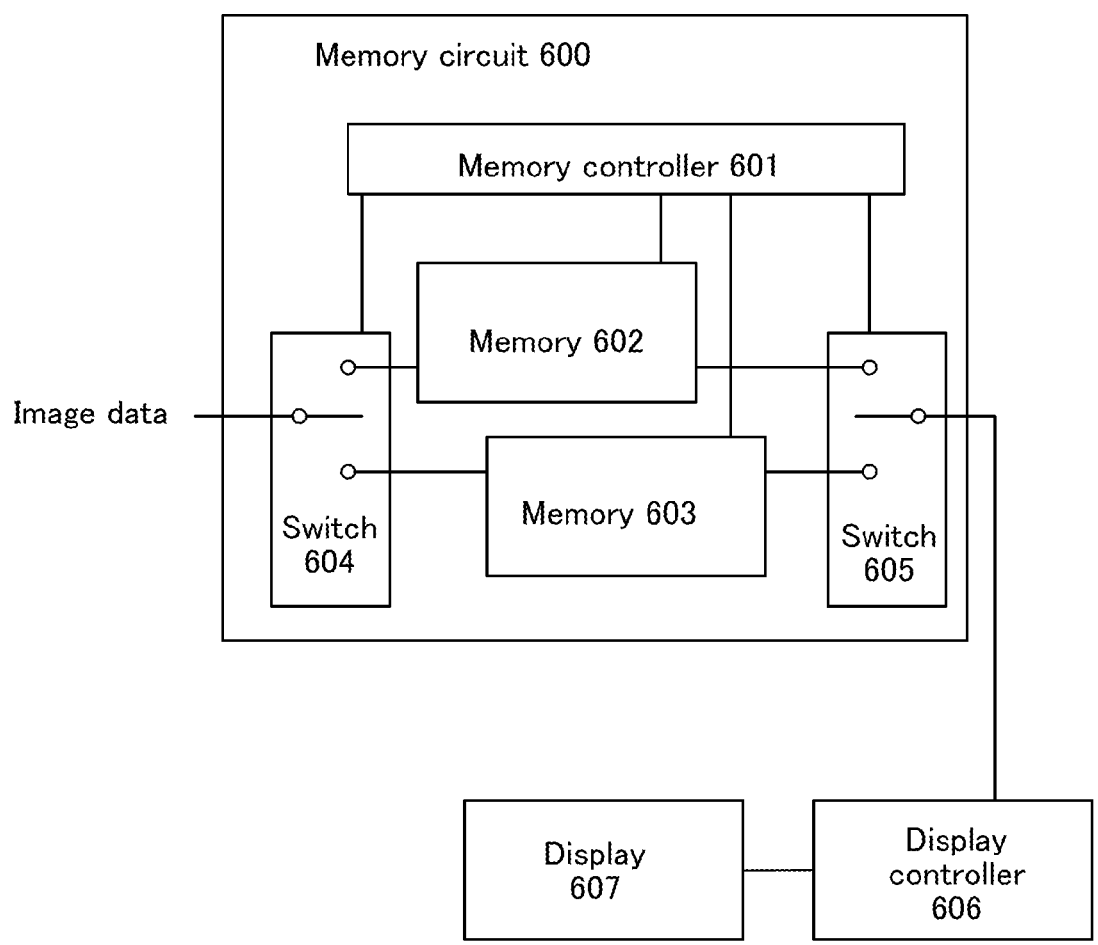
FIG. 15 is a block diagram of a semiconductor device.

Next, FIG. 15 is an example in which the semiconductor device described in the above embodiments is used for a memory circuit 600 of a display. The memory circuit 600 in FIG. 15 includes a memory 602, a memory 603, a switch 604, a switch 605, and a memory controller 601. The memory 602 and the memory 603 are formed using the semiconductor device described in the above embodiments.

First, image data is formed by an application processor (not shown). The formed image data (an input image data 1) is stored in the memory 602 through the switch 604. Then, the image data stored in the memory 602 (a stored image data 1) is transmitted to the display 607 through the switch 605 and the display controller 606.

In the case where the input image data 1 is not changed, the stored image data 1 is read from the display controller 606 through the memory 602 and the switch 605 at a frequency about 30 Hz to 60 Hz in general.

Upon rewriting data on the screen (that is, in the case where the input image data is changed), the application processor generates new image data (an input image data 2). The input image data 2 is stored in the memory 603 through the switch 604. Also during this period, the stored image data 1 is read periodically from the memory 602 through the switch 605. After the termination of storing the new image data in the memory 603 (a stored image data 2), reading of the stored image data 2 is started from the following frame of the display 607; the stored image data 2 is transmitted to the display 607 through the switch 605 and the display controller 606 to be displayed, which is repeated until the next new image data is stored in the memory 602.

In this manner, data writing and data reading are performed alternately in the memory 602 and the memory 603, whereby display is performed on the display 607. Note that the memory 602 and the memory 603 are not necessarily provided separately, and may be obtained by dividing one memory. The semiconductor device described in the above embodiments is used for the memory 602 and the memory 603, whereby a display with sufficiently low power consumption, in which data writing and data reading are performed at high speed can be obtained.

Figure 16:
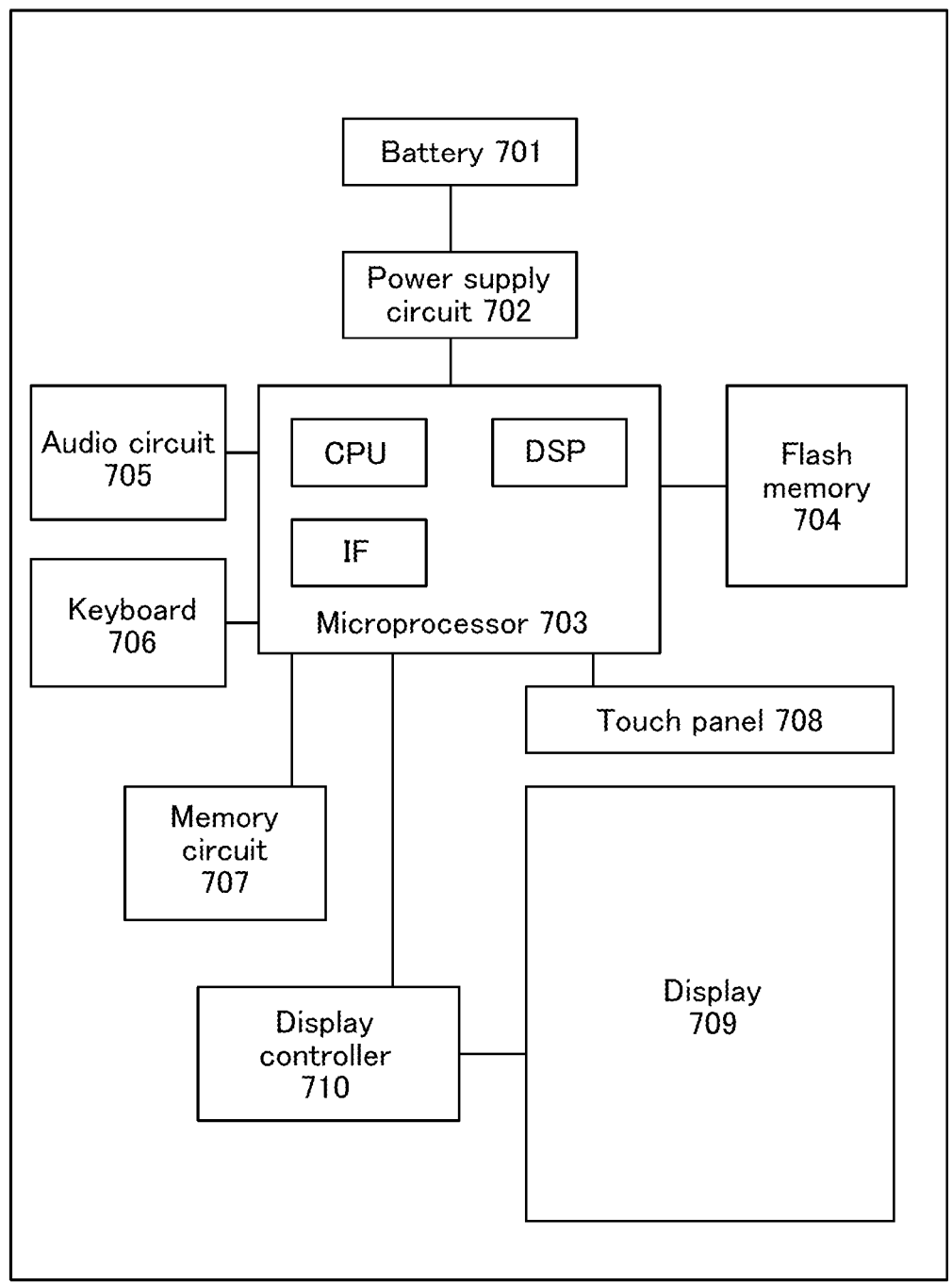
FIG. 16 is a block diagram of a semiconductor device.

FIG. 16 is a block diagram of an e-book reader. The e-book reader in FIG. 16 includes a battery 701, a power supply circuit 702, a microprocessor 703, a flash memory 704, an audio circuit 705, a keyboard 706, a memory circuit 707, a touch panel 708, a display 709, and a display controller 710. The semiconductor device described in the above embodiments can be used for the memory circuit 707. The memory circuit 707 functions to maintain the contents of an e-book temporarily, for example, highlighting. When a user wants to mark part in the e-book, the user can show the part differently from surroundings by changing the display color, underlining, bolding the text, changing the font of the text, or the like, which are the highlighting functions of the e-book reader of this embodiment. That is, data of the content which is required of the user can be stored and maintained by the highlighting functions. In order to maintain that content for a long period, that content may be copied in the flash memory 704. Also in such a case, the semiconductor device described in the above embodiments is used, whereby an e-book reader in which data writing and data reading are performed at high speed and power consumption is sufficiently low can be obtained.

Embodiment 6

In this embodiment, the case where the semiconductor device described in any of the above embodiments is applied to electronic devices will be described with reference to FIGS. 17A to 17F. In this embodiment, examples of the electronic device to which the semiconductor device described in any of the above embodiments is applied include a computer, a mobile phone (also referred to as a cellular phone or a mobile phone device), a personal digital assistant (including a portable game machine, an audio reproducing device, and the like), a camera such as a digital camera or a digital video camera, an electronic paper, and a television device (also referred to as a television or a television receiver).

Figure 17A:
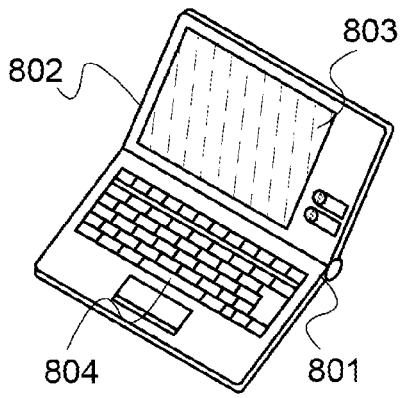
FIGS. 17A to 17F are diagrams each illustrating an electronic device including a semiconductor device.

FIG. 17A shows a laptop personal computer including a housing 801, a housing 802, a display portion 803, a keyboard 804, and the like. At least one of the housing 801 and the housing 802 includes the semiconductor device described in any of the above embodiments. Consequently, a laptop personal computer in which data writing and data reading are performed at high speed and power consumption is sufficiently low can be obtained.

Figure 17D:
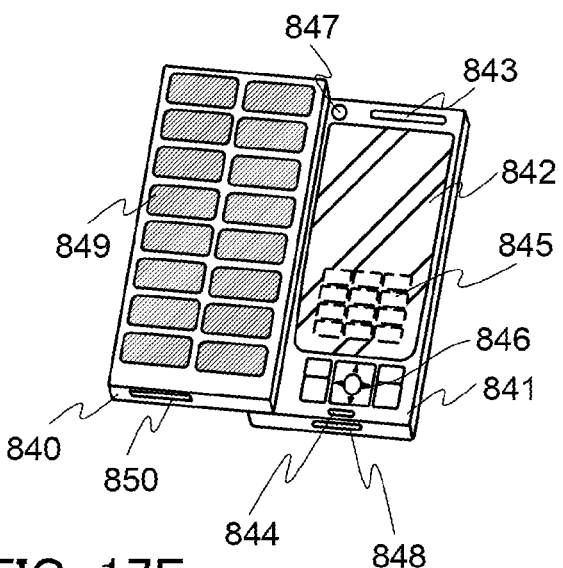
Figure 17B:
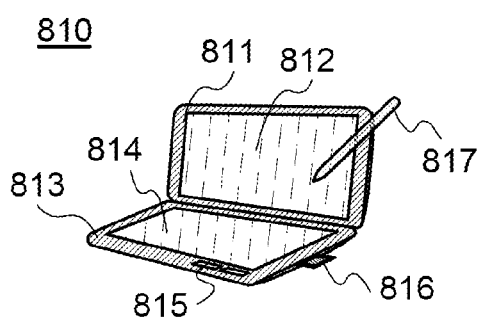

FIG. 17B is a tablet terminal 810. The tablet terminal 810 includes a housing 811 including a display portion 812, a housing 813 including a display portion 814, operation keys 815, and an external interface 816. In addition, a stylus 817 for operating the tablet terminal 810, and the like are provided. An electric circuit is included in each of the housing 811 and the housing 813 and at least one of the electric circuits includes the semiconductor device described in any of the above embodiments. Accordingly, a tablet terminal in which data writing and data reading are performed at high speed and power consumption is sufficiently low can be obtained.

Figure 17E:
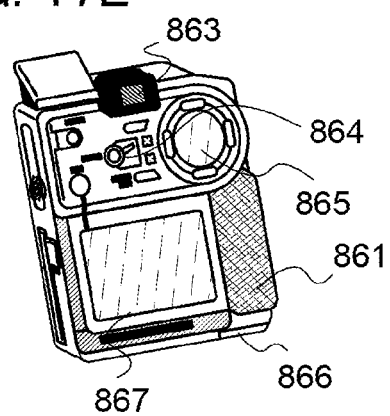
Figure 17C:
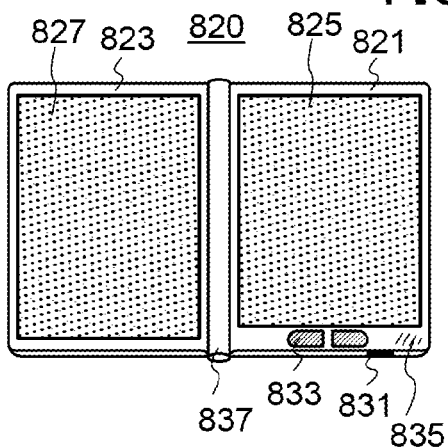

FIG. 17C is an e-book reader 820 incorporating electronic paper, which includes two housings, a housing 821 and a housing 823. The housing 821 and the housing 823 includes a display portion 825 and a display portion 827, respectively. The housing 821 and the housing 823 are connected by a hinge 837 and can be opened and closed along the hinge 837. The housing 821 further includes a power switch 831, operation keys 833, a speaker 835, and the like. At least one of the housing 821 and the housing 823 includes the semiconductor device described in any of the above embodiments. Consequently, an e-book reader in which data writing and data reading are performed at high speed and power consumption is sufficiently low can be obtained.

FIG. 17D is a mobile phone including a housing 840 and a housing 841. Moreover, the housing 840 and the housing 841 in a state where they are developed as illustrated in FIG. 17D can be slid so that one is lapped over the other; in this manner, the size of the mobile phone can be reduced, which makes the mobile phone suitable for being carried. The housing 841 includes a display panel 842, a speaker 843, a microphone 844, operation keys 845, a pointing device 846, a camera lens 847, an external connection terminal 848, and the like. In addition, the housing 840 includes a solar cell 849 for charging the mobile phone, an external memory slot 850, and the like. Further, an antenna is incorporated in the housing 841. At least one of the housing 840 and the housing 841 includes the semiconductor device described in any of the above embodiments. Accordingly, a mobile phone in which data writing and data reading are performed at high speed and power consumption is sufficiently low can be obtained.

FIG. 17E is a digital camera including a main body 861, a display portion 867, an eyepiece 863, an operation switch 864, a display portion 865, a battery 866, and the like. The main body 861 includes the semiconductor devices described in any of the above embodiments. Accordingly, a digital camera in which data writing and data reading are performed at high speed and power consumption is sufficiently low can be obtained.

Figure 17F:
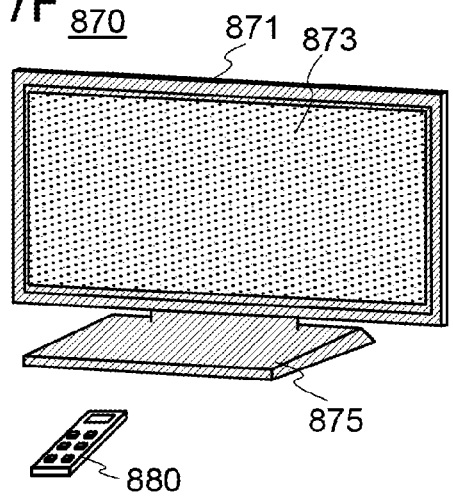

FIG. 17F illustrates a television set 870 including a housing 871, a display portion 873, a stand 875, and the like. The television set 870 can be operated with an operation switch of the housing 871 or a remote controller 880. The semiconductor device described in any of the above embodiments is mounted in the housing 871 and the remote controller 880. Consequently, a television set in which data writing and data reading are performed at high speed and power consumption is sufficiently low can be obtained.

In this manner, the semiconductor device in any of the above embodiments is mounted on each of the electronic devices described in this embodiment. Therefore, electronic devices in which power consumption is reduced can be realized.

In Example 1 and Example 2 described below, an oxide semiconductor layer will be practically formed and results of measuring the relative permittivity of the oxide semiconductor will be described with reference to FIGS. 18A and 18B, FIG. 19, and FIG. 20.

Example 1

Figure 18A:
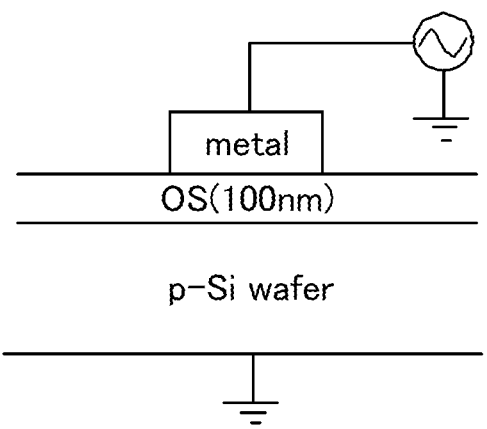
FIGS. 18A and 18B are diagrams illustrating an evaluation method of a semiconductor layer.
Figure 18B:
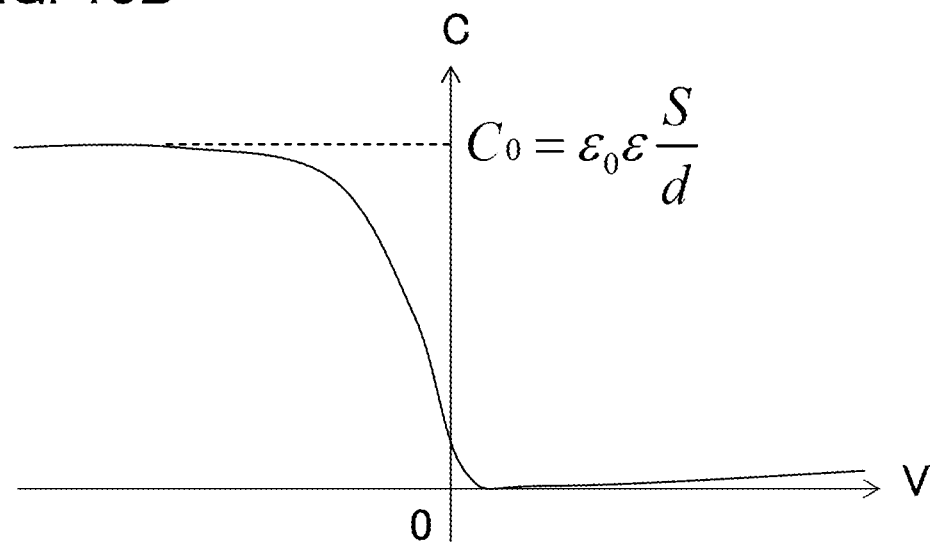

An oxide semiconductor (referred to as OS in the drawing) layer was formed with a thickness of 100 nm over a p-type silicon substrate and CV (capacitance and voltage) of the oxide semiconductor layer was measured, as shown in FIG. 18A. In—Sn—Zn—O-based oxide was used as the oxide semiconductor in this example. Specifically, the oxide semiconductor was formed using an oxide target with an atomic ratio of In:Sn:Zn=2:1:3 and by a sputtering method. Charge storage capacitance ($C_0$) (see FIG. 18B) was determined from the obtained CV measurement results and the relative permittivity was calculated from the charge storage capacitance ($C_0$) using Formula 1. Here, permittivity of the oxide semiconductor is $\in$, vacuum permittivity is $\in_0$, area is S, and the relative permittivity is d.

$$C_0 = \varepsilon_0 \varepsilon \frac{S}{d} \quad \text{[FORMULA 1]}$$

Figure 19:
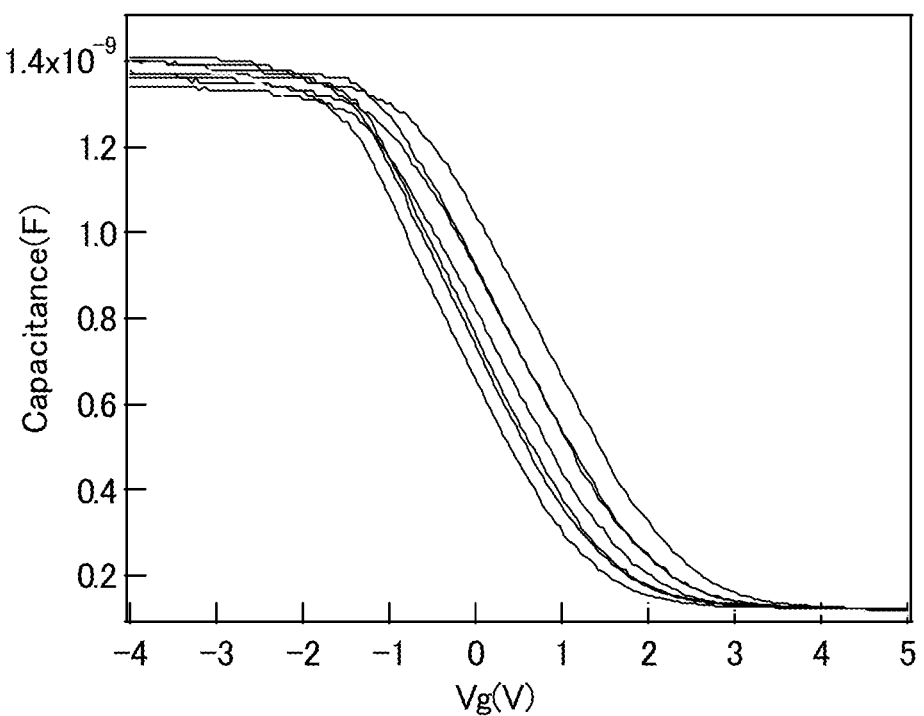
FIG. 19 is a graph showing results of CV measurement.

FIG. 19 shows the measurement result of the CV. The horizontal axis represents applied voltage and the vertical axis represents capacitance. The number of samples n is 7. The result of calculating the relative permittivity (d) of the oxide semiconductor layer formed using the oxide target with an atomic ratio of In:Sn:Zn=2:1:3 was approximately 20.

Example 2

In this example, the relative permittivity of In—Ga—Zn—O-based oxide formed using an oxide target with an atomic ratio of In:Ga:Zn=1:1:1 was measured as in Example 1.

Figure 20:
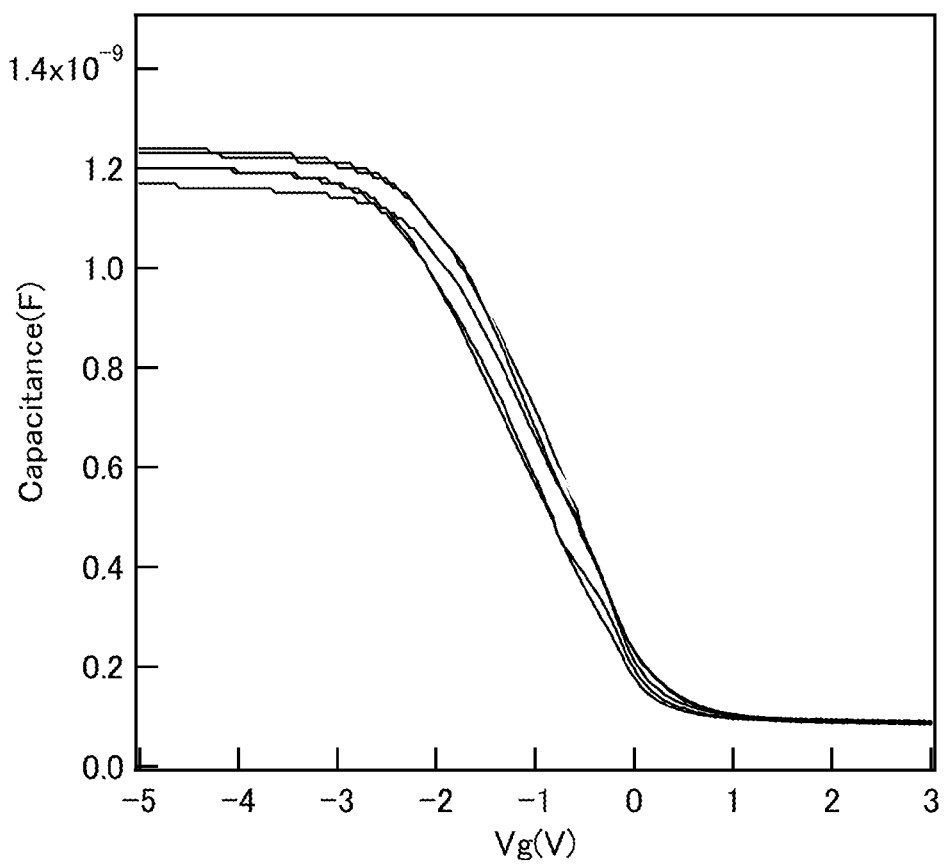
FIG. 20 is a graph showing results of CV measurement.

FIG. 20 shows the measurement result of the CV. The number of samples n is 5. The result of calculating the relative permittivity (d) of the oxide semiconductor layer formed using the oxide target with an atomic ratio of In:Ga:Zn=1:1:1 was approximately 15.

The results of Example 1 and Example 2 show that the relative permittivity of the oxide semiconductor layers tested was higher than that of silicon oxide which is approximately 4.

This application is based on Japanese Patent Application serial no. 2010-293055 filed with Japan Patent Office on Dec. 28, 2010, the entire contents of which are hereby incorporated by reference.

What is claimed is:

1. A semiconductor device comprising:
   an oxide semiconductor layer, the oxide semiconductor layer comprising a first portion and a second portion;
   a transistor comprising a gate electrode, a source electrode, a drain electrode, a gate insulating layer, and the first portion of the oxide semiconductor layer; and
   a capacitor comprising a first electrode, a second electrode overlapping the first electrode, and the second portion of the oxide semiconductor layer between the first electrode and the second electrode, as a dielectric of the capacitor,
   wherein a minimal distance between the first electrode and the second electrode in the capacitor is smaller than a minimal distance between the gate electrode and the source electrode in the transistor by a thickness of the gate insulating layer.

2. The semiconductor device according to claim 1, wherein at least one of the first electrode and the second electrode comprises a metal oxide layer in direct contact with the oxide semiconductor layer.

3. The semiconductor device according to claim 1, wherein the first electrode comprises an In—Ga—Zn—O—N-based compound conductor.

4. The semiconductor device according to claim 1,
   wherein the oxide semiconductor layer comprises an oxide semiconductor or an oxynitride semiconductor, the oxide semiconductor or the oxynitride semiconductor being a non-single-crystal and comprising a triangular or hexagonal atomic arrangement when seen from a direction parallel to a vector normal to an a-b plane and a phase where metal atoms are arranged in a layered manner or the metal atoms and oxygen atoms are arranged in a layered manner in a c-axis direction.

5. The semiconductor device according to claim 1,
wherein the oxide semiconductor layer comprises one or more elements chosen among silicon, germanium, cerium, titanium, tungsten, aluminum, copper, yttrium, lanthanum, vanadium.

6. The semiconductor device according to claim 1,
wherein the first electrode and the second electrode of the capacitor are in direct contact with the second portion of the oxide semiconductor layer.

7. The semiconductor device according to claim 1,
wherein the first portion of the oxide semiconductor layer and the second portion of the oxide semiconductor layer have been formed at a same time from a same oxide semiconductor layer.

8. The semiconductor device according to claim 1,
wherein the outer side edge of the gate insulating layer is covered by the first portion of the oxide semiconductor layer.

9. The semiconductor device according to claim 1,
wherein an extension of the gate insulating layer is not between the first electrode and the second electrode of the capacitor.

10. The semiconductor device according to claim 1,
wherein the second portion of the oxide semiconductor layer is not physically contacting the gate insulating layer.

11. A semiconductor device comprising:
a transistor comprising:
  a gate electrode;
  a first oxide semiconductor layer overlapping with the gate electrode;
  a gate insulating layer interposed between the first oxide semiconductor layer and the gate electrode; and
  a source electrode and a drain electrode, each in electrical contact with the first oxide semiconductor layer; and
a capacitor comprising:
  a first electrode;
  a second electrode electrically connected to one of the source electrode and the drain electrode of the transistor; and
a second oxide semiconductor layer interposed between the first electrode and the second electrode,
wherein a minimal distance between the first electrode and the second electrode in the capacitor is smaller than a minimal distance between the gate electrode and the source electrode in the transistor by a thickness of the gate insulating layer.

12. A semiconductor device according to claim 11,
wherein the gate insulating layer is over the gate electrode; and
wherein the first oxide semiconductor layer is over the gate insulating layer and the gate electrode.

13. The semiconductor device according to claim 12, further comprising:
an insulating layer over the first oxide semiconductor layer, the source electrode and the drain electrode; and
another gate electrode over the insulating layer and overlapping the first oxide semiconductor layer.

14. The semiconductor device according to claim 11,
wherein at least part of the second electrode is formed using a same conductive layer as the source electrode or the drain electrode.

15. The semiconductor device according to claim 11,
wherein the second electrode comprises an extension of one of the source electrode and the drain electrode.

16. The semiconductor device according to claim 11,
wherein the first electrode comprises a same first layer as one of the gate electrode and the source electrode, and
wherein the second electrode comprises a same second layer as the other one of the gate electrode and the source electrode.

17. The semiconductor device according to claim 11,
wherein at least one of the first electrode and the second electrode comprises a metal oxide layer in direct contact with the second oxide semiconductor layer.

18. The semiconductor device according to claim 11,
wherein the first oxide semiconductor layer and the second oxide semiconductor layer are formed during a same process step.

19. The semiconductor device according to claim 11,
wherein at least one of the first electrode and the gate electrode comprises an In—Ga—Zn—O—N-based compound conductor.

20. The semiconductor device according to claim 11,
wherein the first oxide semiconductor layer and the second oxide semiconductor layer each comprise an oxide semiconductor or an oxynitride semiconductor, the oxide semiconductor or the oxynitride semiconductor being a non-single-crystal and comprising a triangular or hexagonal atomic arrangement when seen from a direction parallel to a vector normal to an a-b plane and a phase where metal atoms are arranged in a layered manner or the metal atoms and oxygen atoms are arranged in a layered manner in a c-axis direction.

21. The semiconductor device according to claim 11,
wherein the second oxide semiconductor layer comprises one or more elements chosen among silicon, germanium, cerium, titanium, tungsten, aluminum, copper, yttrium, lanthanum, vanadium.

22. The semiconductor device according to claim 11,
wherein the first electrode and the second electrode of the capacitor are in direct contact with the second oxide semiconductor layer.

23. The semiconductor device according to claim 11,
wherein the first oxide semiconductor layer and the second oxide semiconductor layer have been formed at a same time from a same oxide semiconductor layer.

24. A semiconductor device comprising:
a first conductive layer, the first conductive layer comprising a first portion and a second portion;
a second conductive layer, the second conductive layer comprising a first portion and a second portion;
an oxide semiconductor layer, the oxide semiconductor layer comprising a first portion and a second portion;
a transistor comprising:
  the first portion of the first conductive layer as a gate electrode;
  a gate insulating layer over the gate electrode;
  the first portion of the oxide semiconductor layer over the gate insulating layer and the gate electrode; and
  the first portion and the second portion of the second conductive layer as, respectively, a source electrode and a drain electrode, each in electrical contact with the first portion of the oxide semiconductor layer; and
a capacitor comprising:
  the second portion of the first conductive layer as a first electrode;
  one of the first portion and the second portion of the second conductive layer as a second electrode; and
  the second portion of the oxide semiconductor layer between the first electrode and the second electrode,
wherein a minimal distance between the first electrode and the second electrode in the capacitor is smaller than a minimal distance between the gate electrode and the source electrode in the transistor by a thickness of the gate insulating layer.

25. The semiconductor device according to claim 24, wherein at least one of the first electrode and the second electrode comprises a metal oxide layer in direct contact with the second portion of the oxide semiconductor layer.

26. The semiconductor device according to claim 24, wherein the first electrode and the gate electrode comprise an In—Ga—Zn—O—N-based compound conductor.

27. The semiconductor device according to claim 24, wherein the oxide semiconductor layer comprises an oxide semiconductor or an oxynitride semiconductor, the oxide semiconductor or the oxynitride semiconductor being a non-single-crystal and comprising a triangular or hexagonal atomic arrangement when seen from a direction parallel to a vector normal to an a-b plane and a phase where metal atoms are arranged in a layered manner or the metal atoms and oxygen atoms are arranged in a layered manner in a c-axis direction.

28. The semiconductor device according to claim 24, wherein the second portion of the oxide semiconductor layer comprises one or more elements chosen among silicon, germanium, cerium, titanium, tungsten, aluminum, copper, yttrium, lanthanum, vanadium.

29. The semiconductor device according to claim 24, wherein the first portion of the oxide semiconductor layer and the second portion of the oxide semiconductor layer have been formed at a same time from a same oxide semiconductor layer.

* * * * *